(12) United States Patent
Wang

(10) Patent No.: US 11,005,448 B2
(45) Date of Patent: May 11, 2021

(54) FILM BULK ACOUSTIC WAVE RESONATORS AND FABRICATION METHODS THEREOF

(71) Applicant: SHANGHAI JADIC OPTOELECTRONICS TECHNOLOGY CO., LTD., Shanghai (CN)

(72) Inventor: Xiaochuan Wang, Shanghai (CN)

(73) Assignee: SHANGHAI JADIC OPTOELECTRONICS TECHNOLOGY CO., LTD, Shanghai (CN)

( * ) Notice: Subject to any disclaimer, the term of this patent is extended or adjusted under 35 U.S.C. 154(b) by 15 days.

(21) Appl. No.: 16/392,847

(22) Filed: Apr. 24, 2019

(65) Prior Publication Data
US 2019/0334503 A1 Oct. 31, 2019

(30) Foreign Application Priority Data
Apr. 25, 2018 (CN) .......................... 201810379868.5

(51) Int. Cl.
*H03H 9/17* (2006.01)
*H03H 9/54* (2006.01)
*H03H 9/02* (2006.01)

(52) U.S. Cl.
CPC ........ *H03H 9/172* (2013.01); *H03H 9/02007* (2013.01); *H03H 9/54* (2013.01)

(58) Field of Classification Search
CPC ................. H03H 9/02007; H03H 9/13; H03H 9/17–175; H03H 9/54–589
See application file for complete search history.

(56) References Cited

U.S. PATENT DOCUMENTS

| | | | |
|---|---|---|---|
| 7,212,082 B2* | 5/2007 | Nagao | H01L 41/316 310/324 |
| 7,498,900 B2* | 3/2009 | Lee | H01L 27/0805 333/133 |
| 7,889,027 B2* | 2/2011 | Oka | H03H 9/132 333/187 |
| 8,854,156 B2* | 10/2014 | Iwashita | H03H 3/02 333/187 |

(Continued)

*Primary Examiner* — Dean O Takaoka
*Assistant Examiner* — Alan Wong
(74) *Attorney, Agent, or Firm* — Browdy and Neimark, PLLC

(57) ABSTRACT

A film bulk acoustic wave resonator includes a first substrate; a first insulating material layer, formed on the first substrate; a first cavity, formed in the first insulating material layer with an opening facing away from the first substrate; and an acoustic-wave resonant plate, including a first electrode, a piezoelectric oscillation plate, and a second electrode stacked on the first insulating material layer. The piezoelectric oscillation plate is disposed between the first electrode and the first electrode. The first electrode includes a first electrode cavity above the first cavity. The second electrode includes a second cavity above the first cavity. At least a portion of a boundary of the piezoelectric oscillation plate is formed by a boundary of the first electrode cavity and a boundary of the second electrode cavity. The boundary of the piezoelectric oscillation plate has an irregular polygonal shape without having two parallel edges.

20 Claims, 15 Drawing Sheets

(56) References Cited

U.S. PATENT DOCUMENTS

| | | | |
|---|---|---|---|
| 9,998,087 B2 * | 6/2018 | Tsai | H03H 9/0542 |
| 10,079,589 B2 * | 9/2018 | Lee | H03H 9/173 |
| 10,263,587 B2 * | 4/2019 | Patil | H03H 9/02118 |
| 10,326,425 B2 * | 6/2019 | Belsick | G01N 29/022 |

* cited by examiner

FILM BULK ACOUSTIC WAVE RESONATORS AND FABRICATION METHODS THEREOF

CROSS-REFERENCES TO RELATED APPLICATIONS

This application claims the priority of Chinese Patent Application No. CN201810379868.5, filed on Apr. 25, 2018, the entire content of which is incorporated herein by reference.

FIELD OF THE DISCLOSURE

The present disclosure generally relates to the field of filter technology and, more particularly, relates to film bulk acoustic wave resonators (BAWRs) and fabrication methods thereof.

BACKGROUND

With the development of mobile communication technology, the amount of mobile data transmission has also increased rapidly. Therefore, in situations that the frequency resources are limited and mobile communication devices should be used as few as possible, improving the transmission power of wireless power transmitting devices such as wireless base stations, micro base stations, and repeaters becomes a problem that must be considered. In the meantime, this also means that the requirements on the filter power in the front-end circuits of mobile communication devices are also getting higher and higher.

At present, the high-power filters in devices such as wireless base stations are mainly cavity filters, and their power can reach hundreds of watts; however, the size of these filters is usually too large. Moreover, there are some devices equipped with dielectric filters, which may have an average power over 5 watts; however, the size of these filters is also very large. Because of the large size, these cavity filters cannot be integrated into the radio-frequency (RF) front-end chip.

Film filters, based on semiconductor micromachining technology and mainly including surface acoustic wave resonators (SAWRs) and bulk acoustic wave resonators (BAWRs), are able to overcome the defects of the two filters described above. In particular, BAWRs demonstrate advantages of high operating frequency, high load power, and high quality factor (Q-factor). In addition, the sizes of BAWRs are also small, which is desired for integration.

Currently, how to suppress the crosstalk between lateral spurious waves and longitudinal bulk acoustic wave signals transmitted along the c-axis direction in a BAWR remains a crucial challenge in the field of filter technology. In particular, while ensuring the connection to an external input/output electrical signal source, how to suppress the lateral resonant waves and their reflection in the piezoelectric film and also minimize the reduction of the energy consumption due to the acoustic waves propagating out from the device oscillation plate (i.e., the acoustic-wave resonant plate) has become the focus of the industry.

The disclosed film BAWRs and fabrication methods thereof are directed to solve one or more problems set forth above and other problems in the art.

BRIEF SUMMARY OF THE DISCLOSURE

One aspect of the present disclosure provides a film bulk acoustic wave resonator. The film bulk acoustic wave resonator includes a first substrate; a first insulating material layer, formed on the first substrate; a first cavity, formed in the first insulating material layer with an opening facing away from the first substrate; and an acoustic-wave resonant plate, including a first electrode, a piezoelectric oscillation plate, and a second electrode stacked on the first insulating material layer. The piezoelectric oscillation plate is disposed between the first electrode and the first electrode. The first electrode includes a first electrode cavity located above the first cavity. The second electrode includes a second cavity located above the first cavity. At least a portion of a boundary of the piezoelectric oscillation plate is formed jointly by a boundary of the first electrode cavity and a boundary of the second electrode cavity. The boundary of the piezoelectric oscillation plate has an irregular polygonal shape without having any two edges parallel to each other.

Another aspect of the present disclosure provides a fabrication method for a film bulk acoustic wave resonator. The method includes forming a first insulating material layer on a first substrate; forming a first cavity in the first insulating material layer with an opening facing away from the first substrate; sequentially forming a second conductive film, a piezoelectric film, and a first conductive film on a sacrificial substrate; and forming a first electrode cavity by removing a portion of the first conductive film. A remaining portion of the first conductive film forms a first electrode. The method also includes removing a portion of the piezoelectric film exposed by the first electrode cavity to expose a portion of the second conductive film, and bonding the first substrate and the sacrificial substrate together by bonding the first insulating material layer to the first conductive film. After bonding, the first electrode cavity is located above the first cavity. The method further includes removing the sacrificial substrate; and forming a second electrode cavity by removing a portion of the second conductive film above the first cavity. A remaining portion of the second conductive film forms a second electrode; and forming a piezoelectric oscillation plate by removing a portion of the piezoelectric film in the second electrode cavity to expose a portion of the first conductive film. At least a portion of a boundary of the piezoelectric oscillation plate is jointly by a boundary of the first electrode cavity and a boundary of the second electrode cavity, and the boundary of the piezoelectric oscillation plate has an irregular polygonal shape without having any two edges parallel to each other.

Another aspect of the present disclosure provides a fabrication method for a film bulk acoustic wave resonator. The method includes forming a first insulating material layer on a first substrate; forming a first cavity in the first insulating material layer with an opening facing away from the first substrate; and forming a first sacrificial material layer in the first cavity. The top surface of the first sacrificial material layer is leveled with the top surface of the first insulating material layer. The method also includes sequentially forming a first conductive film and a piezoelectric film on the first insulating material layer and the first sacrificial material layer; and forming a first electrode cavity by removing a portion of the piezoelectric film and a portion of the first conductive film above the first sacrificial material layer to expose a portion of the first sacrificial material layer. A remaining portion of the first conductive film forms a first electrode. The method further includes forming a second sacrificial material layer to fill the first electrode cavity; forming a second conductive film on the piezoelectric film and the second sacrificial material layer; and forming a second electrode cavity by removing a portion of the second conductive film and a portion of the piezoelectric film formed above the first sacrificial material layer to expose a portion of the first conductive film. A remaining portion of the second conductive film forms a second electrode, and a remaining portion of the piezoelectric film forms a piezoelectric oscillation plate. The second electrode cavity and the first electrode cavity are partially overlapped with each other, at least a portion of a boundary of the piezoelectric oscillation plate is formed jointly by a boundary of the first electrode cavity and a boundary of the second electrode cavity, and the boundary of the piezoelectric oscillation plate has an irregular polygonal shape without having any two edges parallel to each other. The method also includes removing the first sacrificial material layer and the second sacrificial material layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrating various embodiments and are not intended to limit the scope of the present disclosure. The above and other objects, features, and advantages of the present disclosure will become more apparent from the following detailed description of the embodiments of the present disclosure with reference to the accompanying drawings. In the embodiments of the present disclosure, a same reference number generally refers to a same component.

Figure 1:
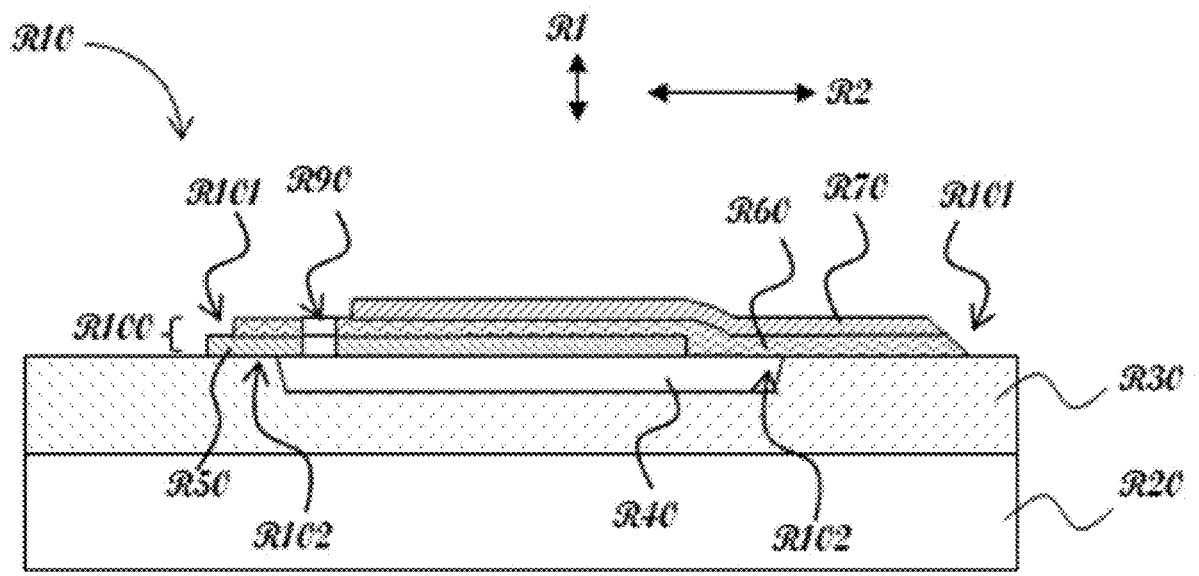
FIG. 1 illustrates a schematic structural view of a vacuum sealed film bulk acoustic wave resonator (BAWR)

In the figures:
R10—film bulk acoustic wave resonator (BAWR);
R100—device oscillation plate (i.e., acoustic-wave resonant plate);
R101, R102—boundary;
R20—substrate;
R22—boundary;
R30—insulating sheet (i.e., insulating material layer);
R40—bottom cavity;
R50—lower electrode;
R60—piezoelectric oscillation plate;
R70—upper electrode;
R90—through hole;
100, 400—first substrate;
110, 410—first insulating material layer;
115, 415—first cavity;
200, 500—second substrate;
201, 401—first conductive film;
202, 402—second conductive film;
205, 405—piezoelectric film;
206—first temperature compensation film;
20, 21, 22, 41, 42, 43—boundary;
210, 510—second insulating material layer;
211, 411—first electrode;
212, 412—second electrode;
215, 415—second cavity;
221, 421—piezoelectric oscillation plate;
231—first temperature compensation film;
232—second temperature compensation film;
241—first structure supporting sheet;
242—second structure supporting sheet;
245—contact plug;
261, 461—first electrode cavity;
262, 462—second electrode cavity;
263, 264—trench;
271—second dielectric layer;
300—sacrificial substrate;
310—first dielectric layer;
451—first sacrificial material layer;
452—second sacrificial material layer.

DETAILED DESCRIPTION

In the following, various exemplary embodiments of the film bulk acoustic wave resonator (BAWR) and the fabrication method according to the present disclosure will be described in detail with reference to the schematic drawings. It should be understood that those skilled in the art can modify the embodiments described herein while still achieving the advantageous effects of the present disclosure. Therefore, the following description should be considered as a broad understanding of the present disclosure, and not intended to limit the scope of the present disclosure.

In the following paragraphs, the present disclosure is more specifically described through various exemplary embodiments with reference to the accompanying drawings. The advantages and features of the present disclosure will be apparent from the description and the appended claims. It should be noted that the drawings are in a simplified form and are all in a non-precise scale merely used to conveniently and clearly explain the embodiments of the present disclosure.

In the following description, it should be understood that when a layer (or film), sheet, region, pattern or structure is referred to as being on a substrate, layer (or film), sheet, region, pad and/or pattern, the layer (or film), sheet, region, pattern or structure can be located directly on another layer or substrate, and/or can be located indirectly on another layer or substrate with an insertion layer disposed between. In addition, it should be understood that when a layer is referred to as being "under" another layer, it may be directly under another layer, and/or one or more insertion layers may be present. Moreover, regarding the "upper" and "lower" relation between different layers, reference may be made to the attached drawings.

FIG. 1 illustrates a schematic structural view of a vacuum sealed film bulk acoustic wave resonator (BAWR). Referring to FIG. 1 the film BAWR R10 includes a substrate R20, an insulating sheet (i.e., an insulating material layer) R30 formed on the substrate R20, a bottom cavity R40 formed in the insulating sheet R30, and a device oscillation plate R100 formed on the substrate R20 and across the bottom cavity R40. The device oscillation plate R100 includes an upper electrode R70, a lower electrode R50, and a piezoelectric oscillation plate R60 formed between the upper electrode R70 and the lower electrode R50. A through hole R90 is formed in the device oscillation plate R100 and connected to the bottom cavity R40. The piezoelectric oscillation plate R60 is usually a piezoelectric film with the piezoelectric main axis c-axis perpendicular to the device oscillation plate R100 as well as the upper electrode R70 and the lower electrode R50.

When a constant electric field is applied to the upper and the lower surfaces of the piezoelectric film of the piezoelectric oscillation plate R60 through the upper electrode R70 and the lower electrode R50, the vertical deformation (extension or contraction) of the piezoelectric film changes with the magnitude of the electric field; when the direction of the electric field is reversed, the vertical deformation (extension or contraction) of the piezoelectric film also changes. When an alternating electric field is applied, the vertical deformation of the piezoelectric film changes between contraction and extension corresponding to the positive and the negative half cycles of the electric field, and thus generates longitudinal bulk acoustic waves propagating along the c-axis direction R1; the longitudinal acoustic waves transmitted to the interfaces between air and the upper or the lower electrode are reflected back. Therefore, the longitudinal acoustic waves are reflected back and forth inside the film such that an oscillation is generated. When the longitudinal acoustic waves propagate in a piezoelectric film with a thickness equal to an odd multiple of the half wavelength of the acoustic wave, standing wave oscillation (resonance) is generated.

However, as the longitudinal acoustic waves propagate in the piezoelectric film, due to the physical Poisson effect of the piezoelectric film, transverse deformation along the thickness direction may cause deformation in the horizontal direction R2, thereby generating lateral spurious waves in the piezoelectric film. The lateral spurious waves propagate in the horizontal direction until reflected by the boundary R102 between the bottom cavity R40 and the device oscillation plate R100 or by the boundary R101 of the piezoelectric oscillation plate R60. After the reflection, the lateral spurious waves propagate in the opposite direction R2 (i.e. in a horizontal direction opposite to the initial direction of propagation). When the lateral spurious waves also generate additional standing wave oscillations that become noise wave, it may not only cause energy loss, but also stimulate longitudinal noise standing waves due to the physical Poisson effect, and thus greatly affect the quality factor of the BAWR, i.e., the Q value.

Therefore, how to suppress the crosstalk between lateral spurious waves and longitudinal bulk acoustic wave signals transmitted along the c-axis direction in a BAWR remains a crucial challenge in the field of filter technology. In particular, while ensuring the connection to an external input/output electrical signal source, how to suppress the lateral resonant waves and their reflection in the piezoelectric film and also minimize the reduction of the energy consumption due to the acoustic waves propagating out from the device oscillation plate has become the focus of the industry.

Figure 2A:
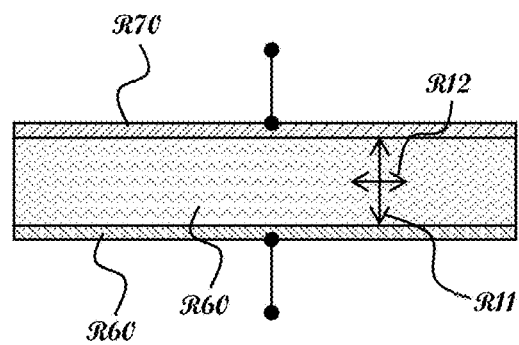
FIG. 2A and FIG. 2B illustrate schematic diagrams for analyzing film BAWR designs according to the present disclosure.
Figure 2B:
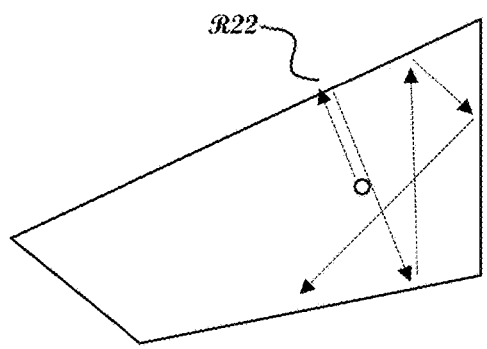

FIG. 2A and FIG. 2B illustrate theoretical diagrams for analyzing film BAWR design according to the present disclosure. Theoretically, a desired BAWR may have a device design shown in FIG. 2A and FIG. 2B. The entire device oscillation plate R100 is formed by bonding three films together. The three films, namely, the upper electrode R70, the lower electrode R50, and the piezoelectric oscillation plate R60 disposed between the upper electrode R70 and the lower electrode R50 have a same size. At the same time, the upper side and the lower side of the device oscillation plate R100 are overhead in air and vacuum, respectively. Therefore, the electric energy applied to the piezoelectric oscillation plate R60 through the upper electrode R70 and the lower electrode R50 is maximally converted to the oscillation of the piezoelectric oscillation plate R60 and the elastic vibration of the upper electrode R70 and the lower electrode R50 that are placed above and below the piezoelectric oscillation plate R60, respectively. As such, the energy consumption due to the acoustic waves propagating out from the device oscillation plate R100 may be reduced, especially the lateral spurious waves propagating out from the device oscillation plate R100 along the horizontal direction may be suppressed. In the meantime, referring to the top view shown in FIG. 2B, the boundary R22 of the entire device oscillation plate R100 should have an irregular polygonal shape without having any two edges parallel to each other, such that the standing wave oscillation caused by back and forth reflection of lateral spurious waves at any point of the piezoelectric oscillation plate R60 may be effectively prevented.

However, such an idealized BAWR is practically infeasible because not only the device oscillation plate needs to be supported appropriately, but also the upper electrode R70 and the lower electrode R50 both need to be connected to an external input/output electrical signal source.

The present disclosure provides a film BAWR and a method for fabricating the film BAWR. According to the disclosed film BAWR, a piezoelectric oscillation plate sandwiched by a first electrode and a second electrode is entirely placed above a first cavity. The boundary of the piezoelectric oscillation plate has an irregular polygonal shape without having any two edges parallel to each other, and thus not only the additional standing wave oscillations that become clutter in the horizontal direction may be eliminated, but also the energy consumed by the lateral spurious waves may be minimized. Therefore, the filtering performance of the film BAWR, including the quality factor, may be effectively improved.

Figure 3:
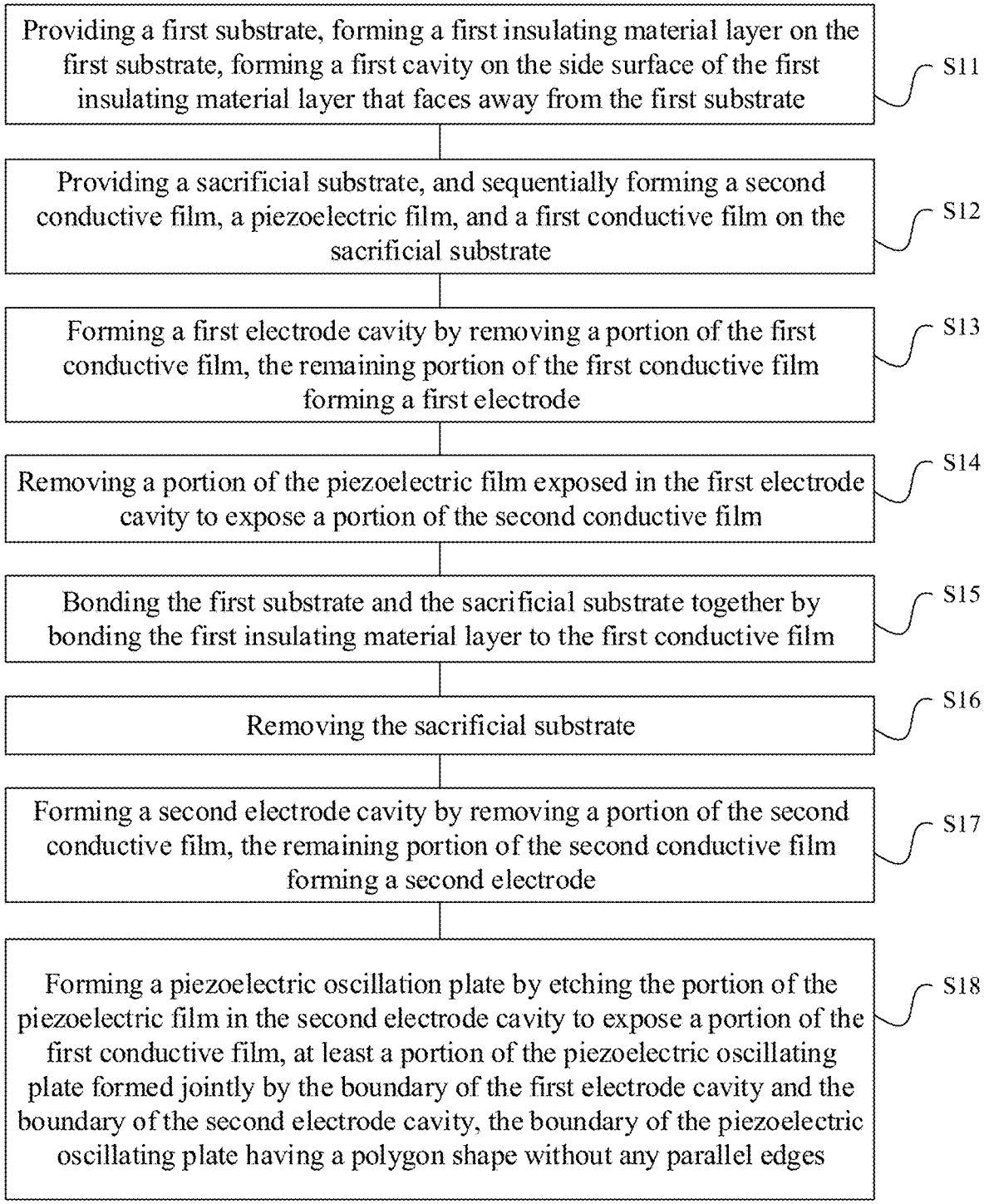
FIG. 3 illustrates a flowchart of an exemplary fabrication method for a film BAWR according to an embodiment of the present disclosure.

FIG. 3 illustrates a flowchart of an exemplary fabrication method for a film BAWR according to an embodiment of the present disclosure. FIGS. 4-20 illustrate schematic views of structures at certain stages of the exemplary method.

Figure 4:
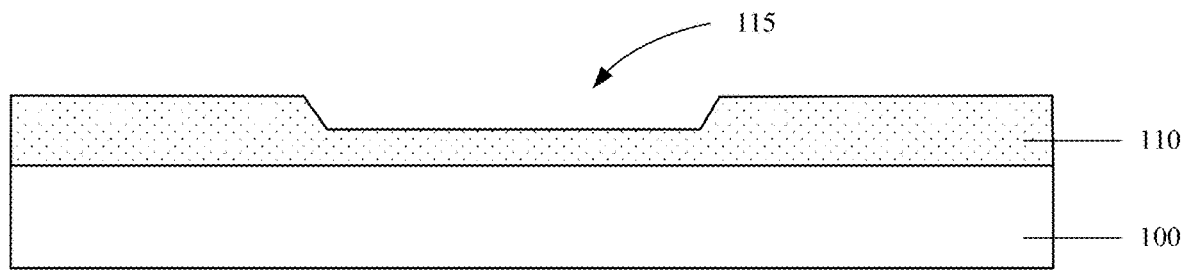
FIGS. 4-20 illustrate schematic views of structures at certain stages of an exemplary method for fabricating a film BAWR according to an embodiment of the present disclosure.

Referring to FIG. 3, at the beginning of the fabrication process for the film BAWR, a first insulating material layer may be formed on a first substrate, and a first cavity may be formed on the side surface of the first insulating material layer that faces away from the first substrate (S11). FIG. 4 illustrates a schematic cross-sectional view of a corresponding structure consistent with some embodiments of the present disclosure.

Referring to FIG. 4, a first substrate 100 may be provided. A first insulating material layer 110 may be formed on the first substrate 100. The first insulating material layer 110 may have a first surface facing the first substrate 100, and a second surface opposite to the first surface. A first cavity 115 may be formed in the first insulating material layer 110 from the second surface. That is, the first cavity 115 may have an opening on the second surface of the first insulating material layer 110.

In one embodiment, the first substrate 100 may be made of any appropriate material known to those skilled in the art. For example, the first substrate 100 may be a single-crystalline silicon substrate, a silicon germanium substrate, a germanium substrate, or any other appropriate semiconductor substrate known to those skilled in the art. According to actual needs, the first substrate 100 may include a buried structure, or a well region formed through an ion implantation process. In other embodiments, a plurality of complementary metal-oxide-semiconductor (CMOS) active devices and other electrically-interconnected components may be formed on the first substrate 100.

In one embodiment, the first insulating material layer 110 may be made of at least one of oxide, nitride, and carbide. For example, the first insulating material layer 110 may be made of silicon oxide, silicon nitride, silicon carbide, SiON, or any other appropriate material.

In one embodiment, the first insulating material layer 110 may be made of silicon oxide. The first insulating material layer 110 may be formed through a chemical vapor deposition (CVD) process. In other embodiments, the first insulating material layer 110 may be formed using a thermal oxidation method, or any other appropriate method.

The first cavity 115 may be formed through a wet etching process, a dry etching process, or a process combining wet etching and dry etching. The first cavity 115 may not be limited to any specific shape. For example, the first cavity 115 may have any appropriate shape, such as a rectangular shape, or other polygonal shape. The first cavity 115 may not be limited to any specific size either. For example, the height, the side length, the occupied area, etc. of the first cavity 115 may be determined according to the actual needs.

Figure 5:
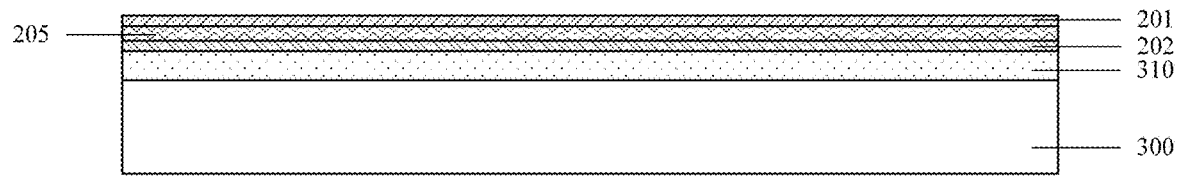

Further, referring to FIG. 3, a sacrificial substrate may be provided, and a second conductive film, a piezoelectric film, and a first conductive film may be sequentially formed on the sacrificial substrate (S12). FIG. 5 illustrates a schematic cross-sectional view of a corresponding structure consistent with some embodiments of the present disclosure.

Referring to FIG. 5, a sacrificial substrate 300 may be provided. A second conductive film 202, a piezoelectric film 205, and a first conductive film 201 may be sequentially formed on the sacrificial substrate 300.

A common substrate may be selected as the sacrificial substrate 300. For example, the sacrificial substrate 300 may be made of the same material as the first substrate 100. However, the sacrificial substrate 300 may not include CMOS active devices or other electrically-interconnected components.

In one embodiment, a first dielectric layer 310 may be formed on the sacrificial substrate 300. For example, the first dielectric layer 310 may be made of a material including at least one of oxide, nitride, and carbide. For example, the first dielectric layer 310 may be made of silicon oxide, silicon nitride, silicon carbide, SiON, or any other appropriate material.

The first dielectric layer 310 may be conducive to subsequently stripping off the sacrificial substrate 300, and in addition, the first dielectric layer 310 may also be able to serve as a temperature compensation film in subsequent steps.

In one embodiment, the first conductive film 201 and the second conductive film 202 may be made of a metal or alloy including at least one of Al, Cu, Ni, W, Ti, Mo, Ag, Au, Pt, etc.

In one embodiment, the piezoelectric film 205 may be made of a material including at least one of piezoelectric crystal or piezoelectric ceramic. For example, the piezoelectric film 205 may be made of at least one of quartz, lithium gallate, lithium germanate, titanium germanate, lithium niobate, lithium tantalate, aluminum nitride, zinc oxide, and lead-zinc titanite.

Further, returning to FIG. 3, the first conductive film may be etched to form a first electrode and a first electrode cavity (S13). In one embodiment, etching the first conductive film 201 (referring to FIG. 5) to form the first electrode and the first electrode cavity may further include the following exemplary steps.

Figure 6:
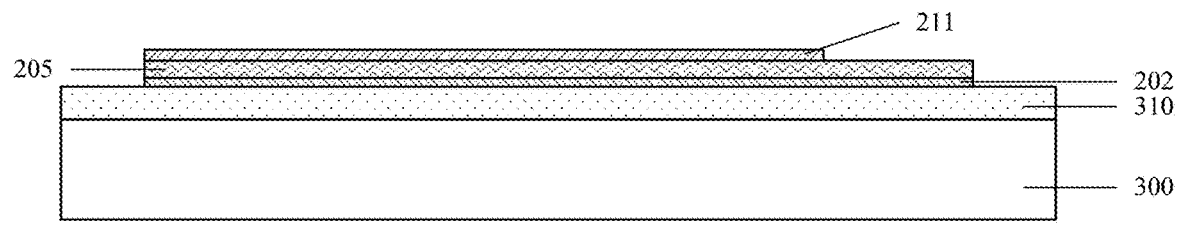

First, a portion of the first conductive film close to one end of the first conductive film may be removed by etching to partially expose the piezoelectric film, and thus form a first electrode. FIG. 6 illustrates a schematic cross-sectional view of a corresponding structure consistent with some embodiments of the present disclosure.

Referring to FIG. 6, a portion of the first conductive film 201 (referring to FIG. 5) close to one of the two ends of the first conductive film 201 may be removed by etching. After removing the portion of the first conductive film 201 at the end, a portion of the piezoelectric film 205 may be exposed at the etched end of the first conductive film 201. At the same time, the remaining portion of the first conductive film 201 may form a first electrode 211. The first conductive film 201 may be etched using a dry etching method or a wet etching method.

In one embodiment, prior to etching the portion of the first conductive film 201 at one end of the first conductive film 201, the multi-layer structure of the second conductive film 202, the piezoelectric film 205, and the first conductive film 201 may be adjusted to a desired pattern range through an etching process.

When the first conductive film is etched by, for example, a wet etching process, a photoresist layer may be used as a mask. In one embodiment, the photoresist layer may be patterned, and the portion of the first conductive film exposed by the patterned photoresist layer may have an irregular polygonal shape without having any two edges parallel to each other.

Figure 7:
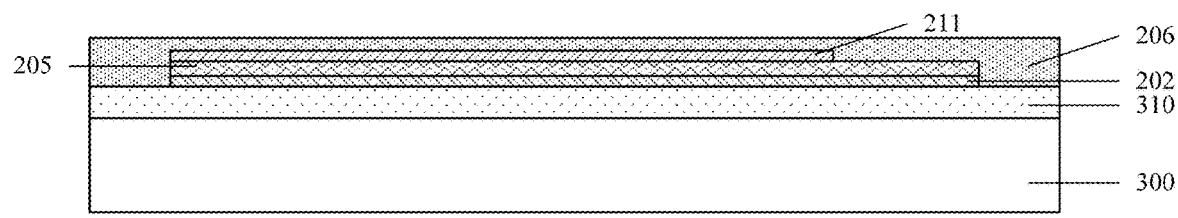

Further, a first temperature compensation film may be formed on the remaining portion of the first conductive film and the exposed portion of the piezoelectric film. FIG. 7 illustrates a schematic cross-sectional view of a corresponding structure consistent with some embodiments of the present disclosure.

Referring to FIG. 7, a first temperature compensation film 206 may be formed on the remaining portion of the first conductive film (i.e., the first electrode 211) and also on the exposed portion of the piezoelectric film 205. In one embodiment, the first temperature compensation film 206 may also cover the sacrificial substrate 300.

The thermal expansion coefficient of the first temperature compensation film 206 may be lower than the thermal expansion coefficient of the second conductive film 202 and/or the thermal expansion coefficient of the first conductive film 201.

In one embodiment, the first temperature compensation film 206 may be made of a material including at least one of oxide, nitride, and carbide. For example, the first temperature compensation film 206 may be made of silicon oxide, silicon nitride, silicon carbide, or SiON. In another example, the first temperature compensation film 206 may be made of the piezoelectric material used to form the piezoelectric film, such as aluminum nitride, etc. The first temperature compensation film 206 may be formed through a CVD process or any other appropriate deposition process.

Figure 8:
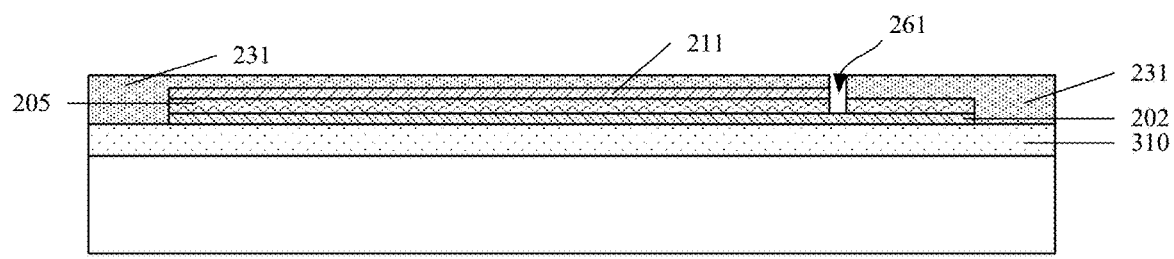

Further, a portion of first temperature compensation film formed directly on the piezoelectric film close to the end of the first conductive film may be etched to expose the piezoelectric film, such that a first electrode cavity and a first temperature compensation film may be formed. FIG. 8 illustrates a schematic cross-sectional view of a corresponding structure consistent with some embodiments of the present disclosure.

Referring to FIG. 8, a portion of the first temperature compensation film formed directly on the piezoelectric film 205 and close to the end of the first conductive film (i.e., the first electrode 211) may be etched to expose the piezoelectric film 205. As such, a first electrode cavity 261 and a first temperature compensation film 231 may be formed. The first temperature compensation film 231 may be a portion of the first temperature compensation film 206 that is divided after being etched to form the first electrode cavity 261.

Figure 9:
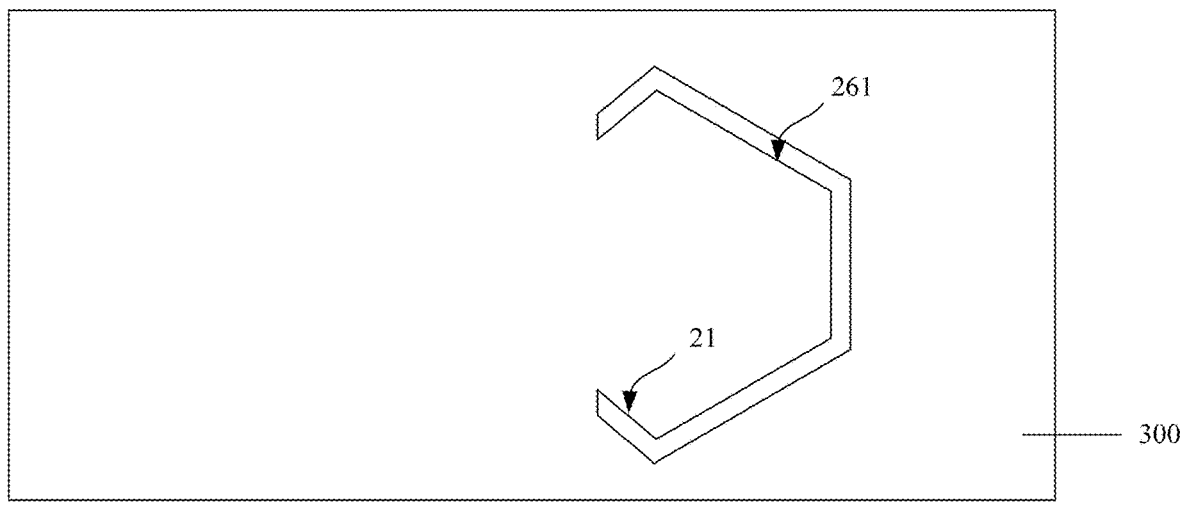

FIG. 9 illustrates a schematic top view of the first electrode cavity. Referring to FIG. 9, along the direction perpendicular to the sacrificial substrate 300, the first electrode cavity 261 may have an irregular shape. In one embodiment, the top view of the first electrode cavity 261 may have a polyline-shaped center line (not shown), and on the same side along the polyline-shaped center line, different edges of the boundary 21 of the first electrode cavity 261 may not be parallel to each other.

Further, returning to FIG. 3, the piezoelectric film may be further etched through the first electrode cavity until a portion of the second conductive film is exposed (S14). Referring to FIG. 8, after etching the first temperature compensation film 206 (referring to FIG. 7) to form the first electrode cavity 261, the portion of the piezoelectric film 205 exposed in the first electrode cavity 261 may be etched to expose a portion of the second conductive film 202.

In one embodiment, the first electrode cavity 261 may be the cavity obtained after performing Step S14. That is, the first electrode cavity 261 may be formed through both the first temperature compensation film 231 and the piezoelectric film 205 to expose a portion of the second conductive film 202. The piezoelectric film 205 may be divided into two parts by the first electrode cavity 261: one of the two parts may be further processed in subsequent steps; and the other part of the piezoelectric film 205 that is not covered by the first electrode 211 may serve as a support for the second electrode in subsequent processes, which will be described in detail below.

Figure 10:
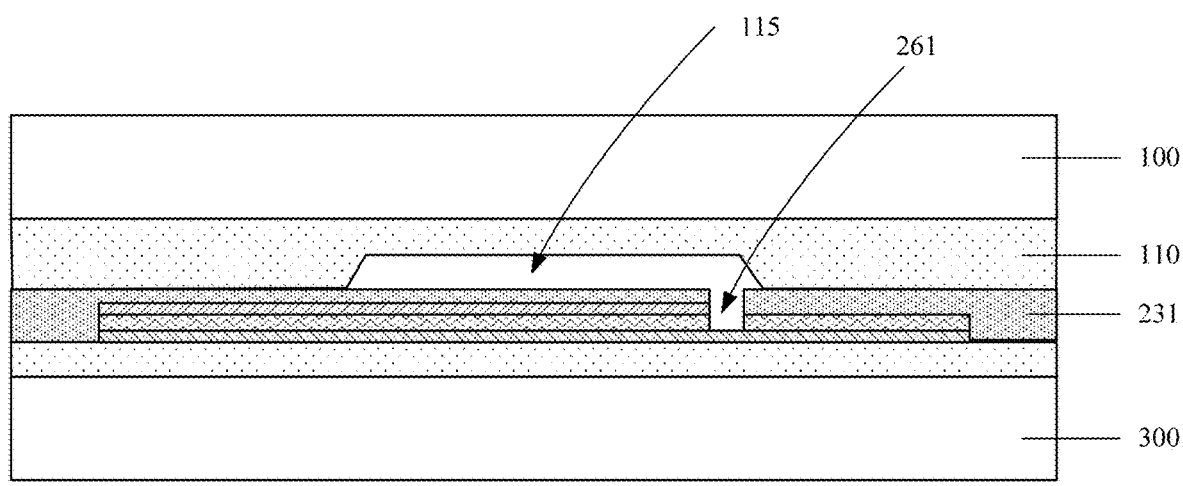

Further, returning to FIG. 3, the first substrate and the sacrificial substrate may be bonded together by bonding the first insulating material layer to the first conductive film (S15). FIG. 10 illustrates a schematic cross-sectional view of a corresponding structure consistent with some embodiments of the present disclosure.

Referring FIG. 10, the first substrate 100 and the sacrificial substrate 300 may be bonded together by bonding the first insulating material layer 110 to the first conductive film (i.e., the first electrode 211).

In one embodiment, the first insulating material layer 110 may be bonded to the first temperature compensation film 231 such that the first substrate 100 and the sacrificial substrate 300 may be bonded together. The bonding process may be any appropriate bonding process according to the current technology.

In one embodiment, after bonding the first substrate 100 and the sacrificial substrate 300 together, the orthogonal projection of the first electrode cavity 261 on the first substrate 100 may fall into the range of the orthogonal projection of the first cavity 115 on the first substrate 100.

Figure 11:
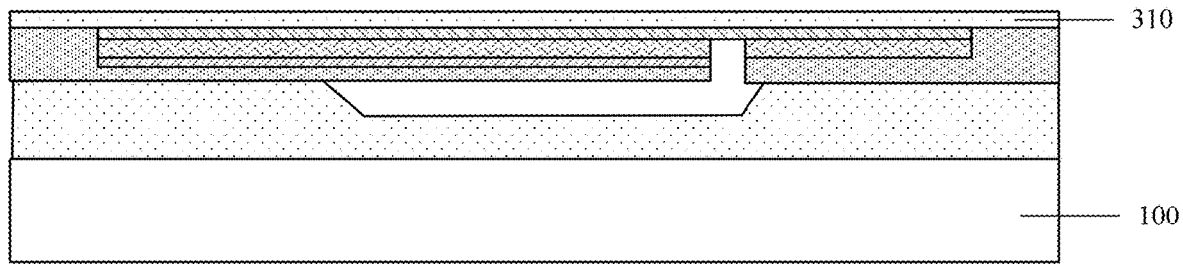

Further, returning to FIG. 3, the sacrificial substrate may be removed (S16). FIG. 11 illustrates a schematic cross-sectional view of a corresponding structure consistent with some embodiments of the present disclosure.

Referring to FIG. 11, the sacrificial substrate 300 (referring to FIG. 10) may be removed. The sacrificial substrate may be removed using a common method, such as a chemical method or a physical method. The chemical method may be a method of eroding the first dielectric layer 310, and the physical method may a method of grinding, cutting, etc.

In one embodiment, the first dielectric layer 310 may be formed, and accordingly, after removing the sacrificial substrate, the first dielectric layer 310 may be thinned down. Thinning down the first dielectric layer 310 may not only remove the damages introduced during the removal of the sacrificial substrate, but also adjust the first dielectric layer 310 to a desired thickness to prepare for subsequent formation of a second temperature compensation film.

Further, returning to FIG. 3, the second conductive film may be etched to form a second electrode and a second electrode cavity (S17). In one embodiment, etching the second conductive film 202 (referring to FIG. 8) to form the second electrode and the second electrode cavity may further include the following exemplary steps.

Figure 12:
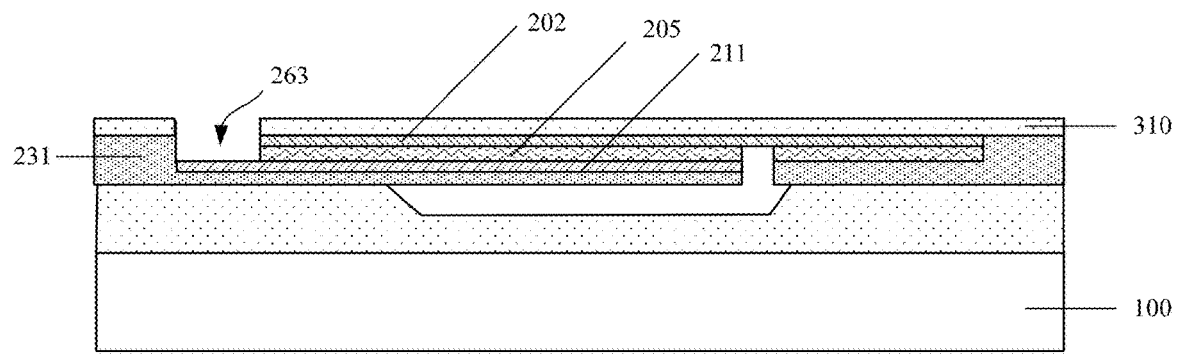

First, by performing an etching process, a plurality of trenches may be formed on the end of the piezoelectric film that is opposite to the end where the first electrode cavity is formed. FIG. 12 illustrates a schematic cross-sectional view of a corresponding structure consistent with some embodiments of the present disclosure.

Referring to FIG. 12, a plurality of trenches 263 may be formed on the end of the piezoelectric film 205 that is opposite to the end where the first electrode cavity 261 is formed (referring to FIG. 10). That is, the plurality of trenches 263 and the first electrode cavity 261 may be formed respectively on two opposite ends of the piezoelectric film 205. The etching process may sequentially remove a portion of the first dielectric layer 310, a portion of the second conductive film 202, and a portion of the piezoelectric film 205 until a portion of the first electrode 211 is exposed.

In one embodiment, the number of the trenches 263 may be more than one, and one of the sidewalls of each trench 263 may include the first temperature compensation film 231. That is, the first temperature compensation film 231 may be exposed as a part of a sidewall of each trench 263.

Figure 13:
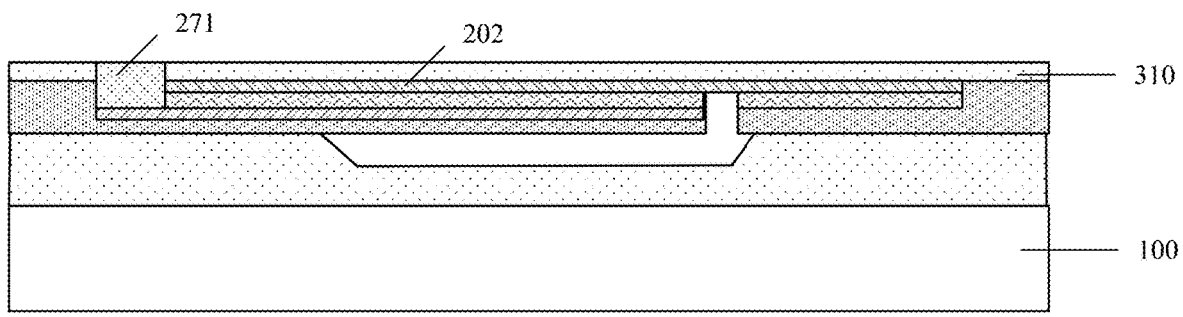

Further, a second dielectric layer may be formed to fill the plurality of trenches. FIG. 13 illustrates a schematic cross-sectional view of a corresponding structure consistent with some embodiments of the present disclosure.

Referring to FIG. 13, a second dielectric layer 271 may be formed to fill the plurality of trenches 263. In one embodiment, the second dielectric layer 271 may be made of a material including at least one of oxide, nitride, and carbide. For example, the second dielectric layer 271 may be made of silicon oxide, silicon nitride, silicon carbide, SiON, or any other appropriate material.

Figure 14:
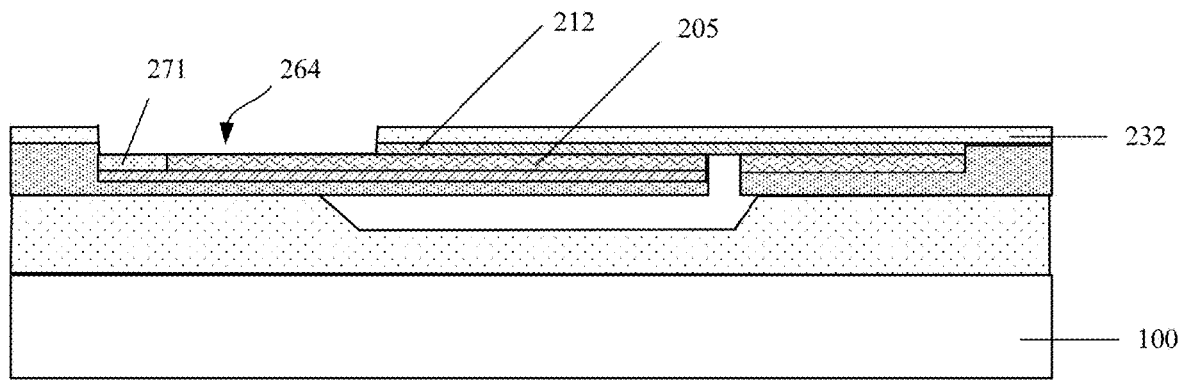

Further, a plurality of trenches may be formed by removing a portion of the first dielectric layer, the second dielectric layer, and the second conductive film through an etching process, and the top surface of the remaining portion of the second dielectric layer may be leveled with the top surface of the piezoelectric film. FIG. 14 illustrates a schematic cross-sectional view of a corresponding structure consistent with some embodiments of the present disclosure.

Referring to FIG. 14, a plurality of trenches 264 may be formed by removing a portion of the first dielectric layer 310 (referring to FIG. 13), the second dielectric layer 271, and the second conductive film 202 (referring to FIG. 13) through an etching process. After the etching process, the top surface of the remaining portion of the second dielectric layer 271 may be leveled with the top surface of the piezoelectric film 205, and the remaining portion of the second conductive film 202 may become a second electrode 212.

Figure 15:
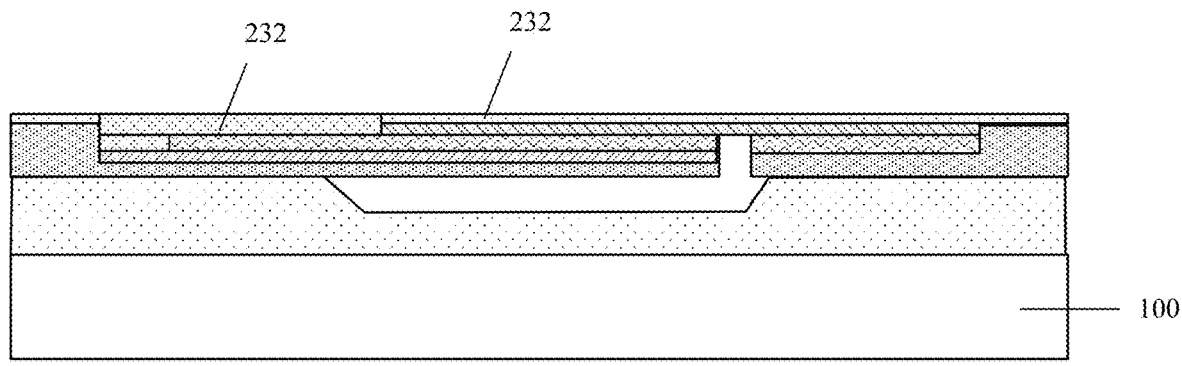

Further, a second temperature compensation film may be formed. FIG. 15 illustrates a schematic cross-sectional view of a corresponding structure consistent with some embodiments of the present disclosure.

Referring to FIG. 15, a second temperature compensation film 232 may be formed (referring to FIG. 14). In one embodiment, the second temperature compensation film 232 may include the remaining portion of the first dielectric layer 310, and a temperature compensation material layer formed in the plurality of trenches 264. That is, the second dielectric layer 232 may not only include the temperature compensation material layer formed in the plurality of trenches 264, but also include the remaining portion of the first dielectric layer 310. The temperature compensation material layer may be made of at least one of oxide, nitride, and carbide. For example, the temperature compensation material layer may be made of silicon oxide, silicon nitride, silicon carbide, SiON, or any other appropriate material. In one embodiment, the temperature compensation material layer and the first dielectric layer 310 may be made of a same material.

In other embodiments, the first dielectric layer 310 may not be formed in the structure; accordingly, only a temperature compensation material layer may need to be formed. However, the temperature compensation material layer may be formed in a range not limited to the range of the plurality of trenches 264, instead, the temperature compensation material layer may be formed in a larger range, for example, a range including the region above the top surface of the first temperature compensation film 231 (referring to FIG. 12) and the top surface of the second conductive film 202 (referring to FIG. 12). The temperature compensation material layer may be formed through a CVD process.

Figure 16:
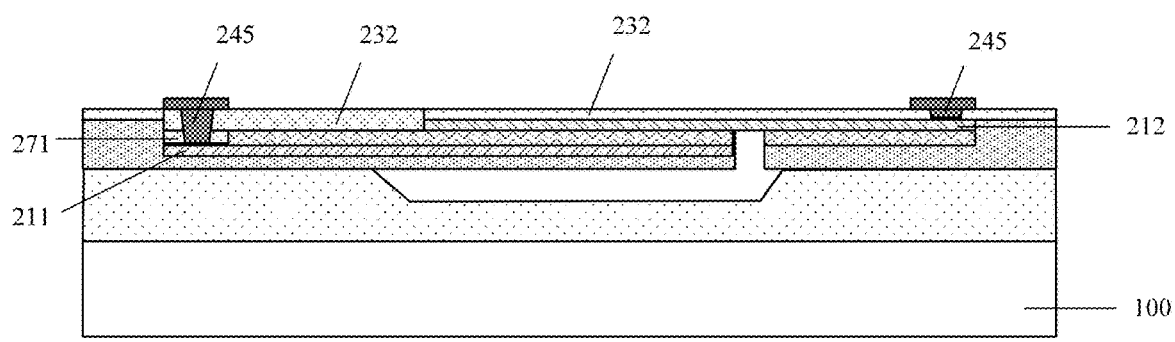

In one embodiment, a plurality of contact plugs may be formed. The plurality of contact plugs may penetrate through the second temperature compensation film and may be connected to the first electrode and the second electrode, respectively at the two opposite ends of the first cavity. FIG. 16 illustrates a schematic cross-sectional view of a corresponding structure consistent with some embodiments of the present disclosure.

Referring to FIG. 16, a plurality of contact plugs 245 may be formed. In one embodiment, the plurality of contact plugs 245 may penetrate through the second temperature compensation film 232 and may be connected to the first electrode 211 and the second electrode 212, respectively at the two opposite ends of the first cavity 115. Each contact plug 245 may include a contact pillar and a soldering pad. As such, electrical leads to the first electrode 211 and the second electrode 212 may be formed.

Figure 17:
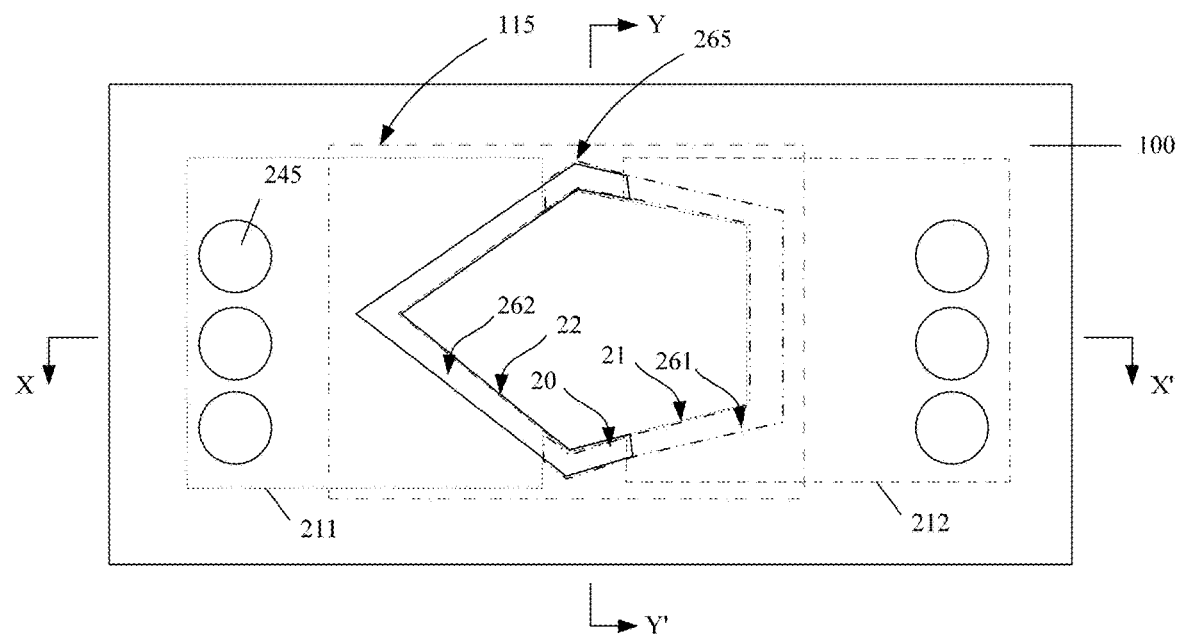
Figure 18:
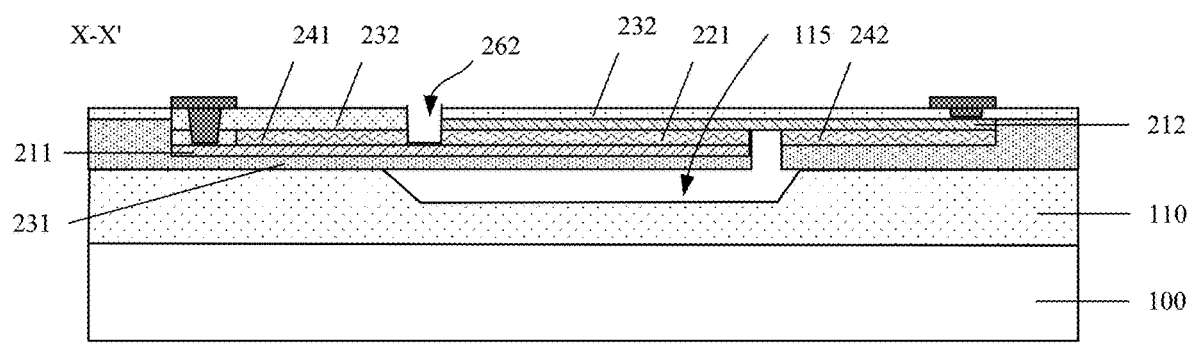
Figure 19:
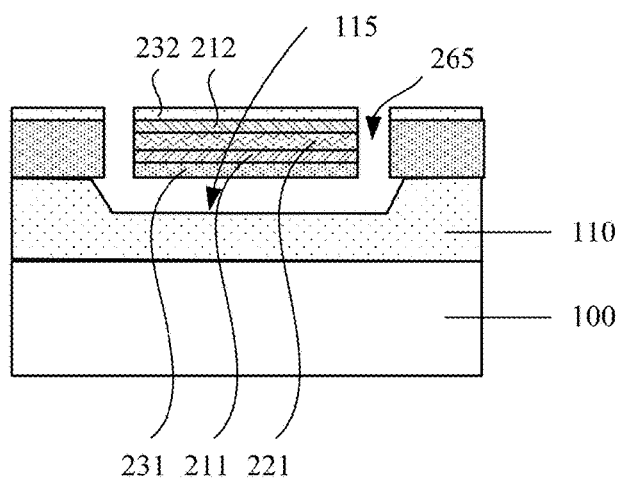

Further, the second electrode cavity may be formed by removing a portion of the second temperature compensation film at a position close to an end of the second electrode. FIGS. 17-19 illustrate schematic views of a corresponding structure consistent with some embodiments of the present disclosure. Specifically, FIG. 17 illustrates a schematic top view of the structure, FIG. 18 illustrates a schematic cross-sectional view of the structure shown in FIG. 17 along an X-X' direction, and FIG. 19 illustrates a schematic cross-sectional view of the structure shown in FIG. 17 along a Y-Y' direction.

Referring to FIGS. 17-19, the second temperature compensation film may be etched to form the second electrode cavity 262. In one embodiment, a portion of the second temperature compensation film 232 formed directly on the piezoelectric film 205 (referring to FIG. 14) and close to an end of the second conductive film 202 may be removed through an etching process to expose the piezoelectric film. As such, a second electrode cavity 262 may be formed. Therefore, the second temperature compensation film 232 may be divided after the second electrode cavity 262 is formed through the etching process.

FIG. 17 illustrates a schematic top view of the first electrode cavity 261 and the second electrode cavity 262. Referring to FIG. 17, in a direction perpendicular to the first substrate 100, the projections of the first electrode cavity 261 and the second electrode cavity 262 may both have irregular shapes. For example, each top view of the first electrode cavity 261 and the second electrode cavity 262 may have a polyline-shaped center line. On the same side along the polyline-shaped center line of the first electrode cavity 261, different edges of the boundary 21 of the first electrode cavity 261 may not be parallel to each other, and on the same side along the polyline-shaped center line of the second electrode cavity 262, different edges of the boundary 22 of the second electrode cavity 262 may not be parallel to each other either. In addition, each edge of the boundary 21 of the first electrode cavity 261 may not be parallel to any edge of the boundary 22 of the second electrode cavity 262. Moreover, the orthogonal projection of the first electrode cavity 261 and the orthogonal projection of the second electrode cavity 262 may have an overlapped region 265.

Further, the piezoelectric film may be etched from the second electrode cavity to expose a portion of the first conductive film (i.e. the first electrode) and also form a piezoelectric oscillation plate, the piezoelectric oscillation plate may have at least a portion of the boundary formed jointly by a portion of the boundary of the first electrode cavity and a portion of the boundary of the second electrode cavity, and the boundary of the piezoelectric oscillation plate may have an irregular polygonal shape without having any two edges parallel to each other (S18).

Referring to FIGS. 17-19, an etching process may be performed on the piezoelectric film 205 (referring to FIG. 14) starting from the second electrode cavity 262. As a portion of the first conductive film (i.e. the first electrode 211) is exposed, a piezoelectric oscillation plate 221 may be formed from the piezoelectric film 205. At least a portion of the boundary 20 of the piezoelectric oscillation plate 221 may be formed jointly by a portion of the boundary of the first electrode cavity 261 and a portion of the boundary of the second electrode cavity 262, and the boundary 20 of the piezoelectric oscillation plate 221 may have an irregular polygonal shape without having any two edges parallel to each other.

In one embodiment, the etching process performed on the piezoelectric film may be the same etching process performed to form the second electrode cavity 262. That is, the etching process may be continuously performed to etch the second temperature compensation film 232 and the piezoelectric film 205 to form the second electrode cavity 262 and the piezoelectric oscillation plate 221. The piezoelectric film may be divided into three portions by the first electrode cavity 261 and the second electrode cavity 262. The three portions of the piezoelectric film may include a first structure supporting sheet 241, a second structure supporting sheet 242, and the piezoelectric oscillation plate 221 located between the first structure supporting sheet 241 and the second structure supporting sheet 242. The first structure supporting sheet 241 may provide support for the first electrode 211, and the second structure supporting sheet 242 may provide support for the second electrode 212. Therefore, in one embodiment, the first structure supporting sheet 241 and the second structure supporting sheet 242 may be formed in a same layer as the piezoelectric oscillation plate 221, but may be separated from the piezoelectric oscillation plate 221 in a subsequent process. Further, the first structure supporting sheet 241 and the second electrode 242 may be located at the two opposite ends of the piezoelectric oscillation plate 221.

The piezoelectric oscillation plate 221, the first electrode 211, and the second electrode 212 may together form an acoustic-wave resonant plate (i.e., a device oscillation plate).

In one embodiment, the fabrication method may further include the following exemplary steps.

Figure 20:
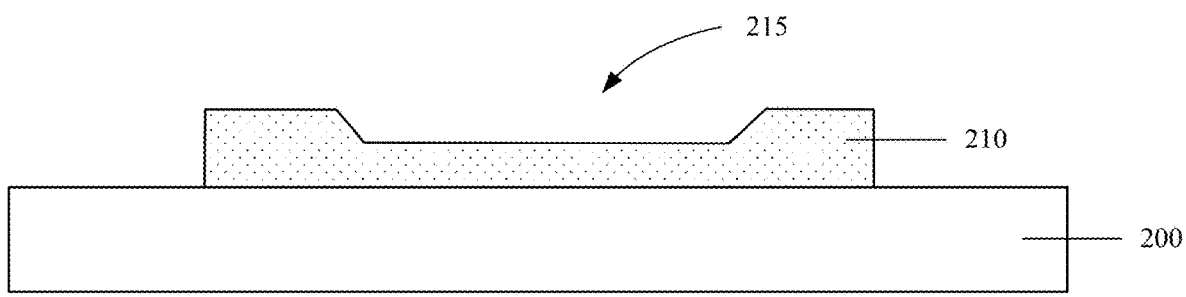

First, a second substrate may be provided, and a second insulating material layer may be formed on the second substrate. Then, a second cavity may be formed on the side surface of the second insulating material layer that faces away from the second substrate. FIG. 20 illustrates a schematic cross-sectional view of a corresponding structure consistent with some embodiments of the present disclosure.

Referring to FIG. 20, a second substrate 200 may be provided. A second insulating material layer 210 may be formed on the second substrate 200. The second insulating material layer 210 may have a first surface facing the second substrate 200, and a second surface opposite to the first surface. A second cavity 215 may be formed in the second insulating material layer 210 from the second surface. That is, the second cavity 215 may have an opening on the second surface of the second insulating material layer 210.

Figure 21:
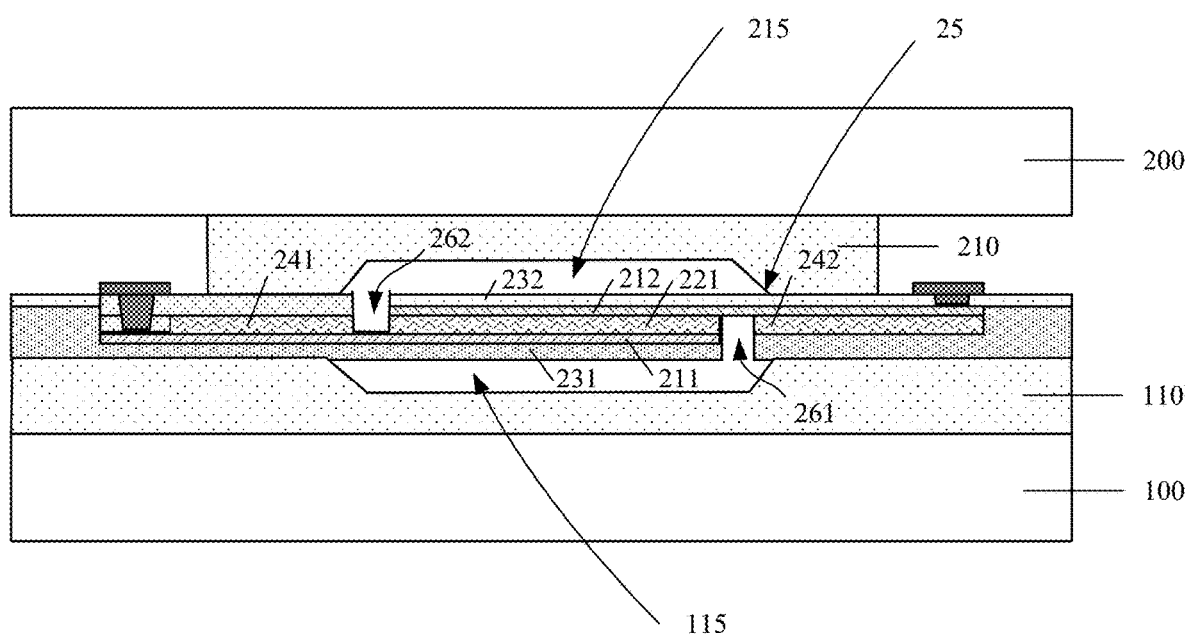
FIG. 21 illustrate a schematic top view of a film BAWR according to an embodiment of the present disclosure.

Further, the second substrate and the first substrate may be bonded together by bonding the second insulating material layer to the second conductive film (i.e., the second electrode). FIG. 21 illustrates a schematic cross-sectional view of a corresponding structure consistent with some embodiments of the present disclosure.

Referring to FIG. 21, by bonding the second insulating material layer 215 to the second conductive film (i.e., the second electrode 212), the second substrate 200 and the first substrate 100 may be bonded together. The second cavity 215 and the first cavity 115 may be located on the two opposite side surfaces of the acoustic-wave resonant plate, respectively. For example, the first cavity 115 may be located below the first electrode 211 of the acoustic-wave resonant plate, and the second cavity 215 may be located above the second electrode 212 of the acoustic-wave resonant plate. The boundary 25 of the second cavity 215 may be a portion of the boundary 20 of the piezoelectric oscillation plate 221.

In one embodiment, with respect to the acoustic-wave resonant plate formed by the first electrode 211, the piezoelectric oscillation plate 221, and the second electrode 212, the second cavity 215 and the first cavity 115 may be mirror images of each other.

Through the fabrication steps described above, film BAWRs consistent with various embodiments of the present disclosure may be fabricated. Further, the present disclosure also provides a film BAWR. FIGS. 17-19 illustrate schematic views of an exemplary film BAWR consistent with various embodiments of the present disclosure. Specifically, FIG. 17 illustrates a schematic top view of the film BAWR, FIG. 18 illustrates a schematic cross-sectional view of the film BAWR shown in FIG. 17 along an X-X' direction, and FIG. 19 illustrates a schematic cross-sectional view of the film BAWR shown in FIG. 17 along a Y-Y' direction.

Referring to FIGS. 17-19, the film BAWR may include a first substrate 100, a first insulating material layer 110 formed on the first substrate 100, and a first cavity 115 formed in the first insulating material layer 110. The first cavity 115 may be formed on the surface of the first insulating material layer 110 that faces away from the first substrate 100.

The film BAWR may also include an acoustic-wave resonant plate formed above the first insulating material layer 110. The acoustic-wave resonant plate may include a first electrode 211, a second electrode 212, and a piezoelectric oscillation plate 221 formed between the first electrode 211 and the second electrode 212. The first electrode 221 may be disposed above the first insulating material layer 110 and the first cavity 115, and may include a first electrode cavity 261 disposed above the first cavity 115. The second electrode 212 may be disposed above the first insulating material layer 110 and the first cavity 115, and may include a second electrode cavity 262 disposed above the first cavity 115. At least a portion of the boundary 20 of the piezoelectric oscillation plate 221 may be formed jointly by the boundary of the first electrode cavity 261 and the boundary of the second electrode cavity 262, and the boundary 20 of the piezoelectric oscillation plate 221 may have an irregular polygonal shape without having any two edges parallel to each other.

In one embodiment, the first electrode 211 may be formed from a first conductive film only. The first electrode 211 (and the first conductive film) may be made of a metal or alloy including at least one of Al, Cu, Ni, W, Ti, Mo, Ag, Au, Pt, etc.

In one embodiment, the second electrode 212 may be formed from a second conductive film only. The second electrode 212 (and the second conductive film) may be made of a metal or alloy including at least one of Al, Cu, Ni, W, Ti, Mo, Ag, Au, Pt, etc.

In one embodiment, the acoustic-wave resonant plate may also include a first temperature compensation film 231 formed above the first cavity 115 and on the side surface of the first electrode 211 far away from the piezoelectric oscillation plate 221. That is, the first temperature compensation film 231 and the piezoelectric oscillation plate 221 may be disposed on the two opposite side surfaces of the first electrode 211, respectively. The thermal expansion coefficient of the first temperature compensation film 231 may be lower than the thermal expansion coefficient of the first electrode 211 and/or the thermal expansion coefficient of the second electrode 212.

In one embodiment, the first temperature compensation film 231 may be made of at least one of oxide, nitride, and carbide. For example, the first temperature compensation film 231 may be made of silicon oxide, silicon nitride, silicon carbide, SiON, or any other appropriate material.

In one embodiment, the acoustic-wave resonant plate may also include a second temperature compensation film 232 formed above the first cavity 115 and on the side surface of the second electrode 212 far away from the piezoelectric oscillation plate 221. That is, the second temperature compensation film 232 and the piezoelectric oscillation plate 221 may be disposed on the two opposite side surfaces of the second electrode 212, respectively. The thermal expansion coefficient of the second temperature compensation film 232 may be lower than the thermal expansion coefficient of the first electrode 211 and/or the thermal expansion coefficient of the second electrode 212.

In one embodiment, the second temperature compensation film 232 may be made of at least one of oxide, nitride, and carbide. For example, the first temperature compensation film 231 may be made of silicon oxide, silicon nitride, silicon carbide, SiON. Alternatively, the first temperature compensation film 231 may be made of any other appropriate material, including the piezoelectric material used to form the piezoelectric film, such as aluminum nitride, etc.

In one embodiment, the acoustic-wave resonant plate may also include a first structure supporting sheet 241 bonded to the first electrode 211, and a second structure supporting sheet 242 bonded to the second electrode 212. The first structure supporting sheet 241 and the second structure supporting sheet 242 may be formed in a same layer as the piezoelectric oscillation plate 221, but may be separated from the piezoelectric oscillation plate 221. In addition, the first structure supporting sheet 241 and the second electrode 242 may be located at the two opposite ends of the piezoelectric oscillation plate 221.

In one embodiment, the film BAWR may further include a second insulating material layer 210. The second insulating material layer 210 may be disposed on the side surface of the acoustic-wave resonant plate far away from the first insulating material layer 110. A second cavity 215 may be formed in the second insulating material layer 210. With respect to the piezoelectric oscillation plate 221, the second cavity 215 may be opposite to the first cavity 115 and may have an opening facing the piezoelectric oscillation plate 221. The boundary 25 of the second cavity 215 may serve as a portion of the boundary of the piezoelectric oscillation plate 221.

In one embodiment, with respect to the acoustic-wave resonant plate formed by the first electrode 211, the piezoelectric oscillation plate 221, and the second electrode 212, the second cavity 215 and the first cavity 115 may be mirror images of each other.

In one embodiment, the first insulating material layer 110 and the second insulating material layer 210 may be made of at least one of oxide, nitride, and carbide. For example, the first insulating material layer 110 and the second insulating material layer 210 may be made of silicon oxide, silicon nitride, silicon carbide, SiON, or any other appropriate material.

In one embodiment, the piezoelectric oscillation plate 221 may be made of a material including at least one of piezoelectric crystal or piezoelectric ceramic. For example, the piezoelectric oscillation plate 221 may be made of at least one of quartz, lithium gallate, lithium germanate, titanium germanate, lithium niobate, lithium tantalate, aluminum nitride, zinc oxide, and lead-zinc titanite.

In one embodiment, the film BAWR may also include a second substrate 200. The second insulating material layer 210 may be disposed on the second substrate 200.

Figure 22:
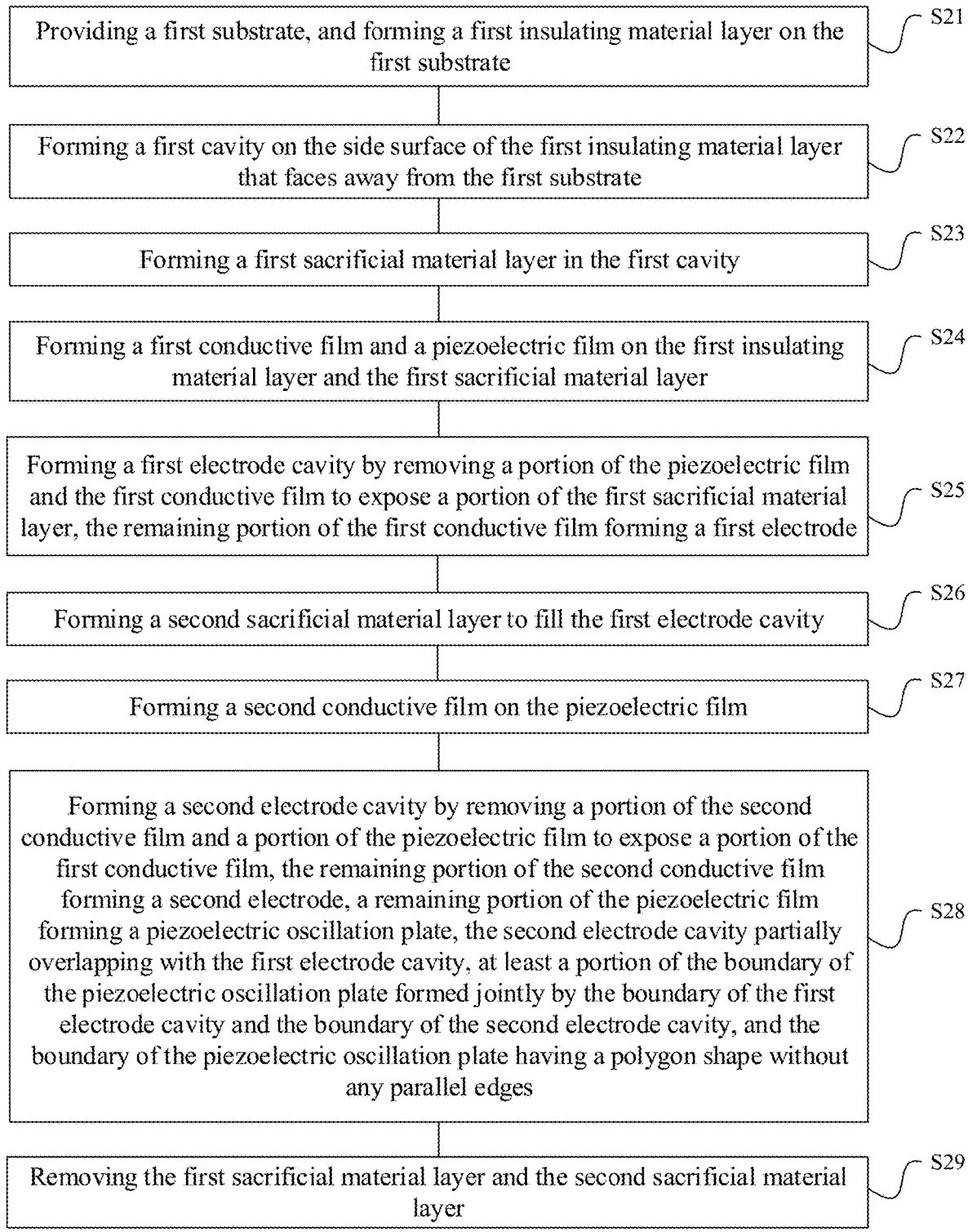
FIG. 22 illustrates a flowchart of an exemplary fabrication method for a film BAWR according to another embodiment of the present disclosure.

The present disclosure also provides another method for fabricating a film BAWR. FIG. 22 illustrates a flowchart of an exemplary fabrication method for a film BAWR according to another embodiment of the present disclosure. FIGS. 23-32, and 34-35 illustrate schematic views of structures at certain stages of the exemplary fabrication method.

Figure 23:
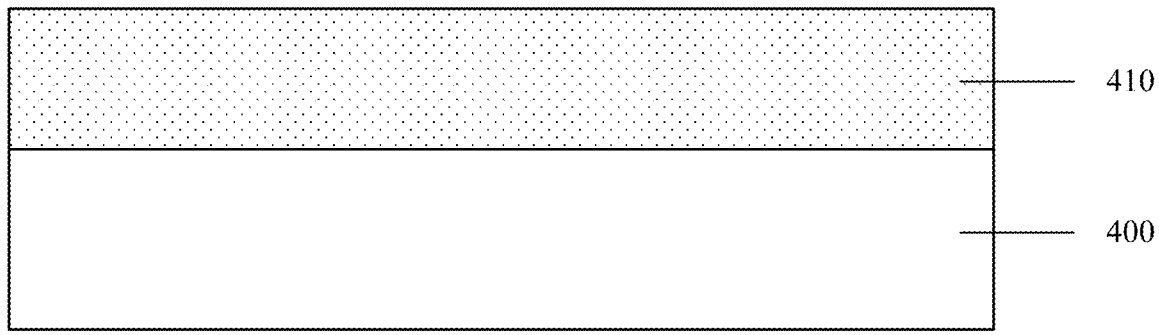
FIGS. 23-32, and 34-35 illustrate schematic views of structures at certain stages of an exemplary method for fabricating a film BAWR according to another embodiment of the present disclosure.

Referring to FIG. 22, at the beginning of the fabrication process for the film BAWR, a first insulating material layer may be formed on a first substrate (S21). FIG. 23 illustrates a schematic cross-sectional view of a corresponding structure consistent with some embodiments of the present disclosure.

Referring to FIG. 23, a first substrate 400 may be provided. A first insulating material layer 410 may be formed on the first substrate 400. The first insulating material layer 410 may have a first surface facing the first substrate 400, and a second surface opposite to the first surface.

In one embodiment, the first substrate 400 may be made of any appropriate material known to those skilled in the art. For example, the first substrate 400 may be a single-crystalline silicon substrate, a silicon germanium substrate, a germanium substrate, or any other appropriate semiconductor substrate known to those skilled in the art. According to actual needs, the first substrate 400 may include a buried structure, or a well region formed by ion implantation. In other embodiments, a plurality of CMOS active devices and other electrically-interconnected components may be formed on the first substrate 400.

In one embodiment, the first insulating material layer 410 may be made of at least one of oxide, nitride, and carbide. For example, the first insulating material layer 410 may be made of silicon oxide, silicon nitride, silicon carbide, SiON, or any other appropriate material.

In one embodiment, the first insulating material layer 410 may be made of silicon oxide. The first insulating material layer 410 may be formed through a CVD process. Alternatively, the first insulating material layer 410 may be formed using a thermal oxidation method, or any other appropriate method.

Figure 24:
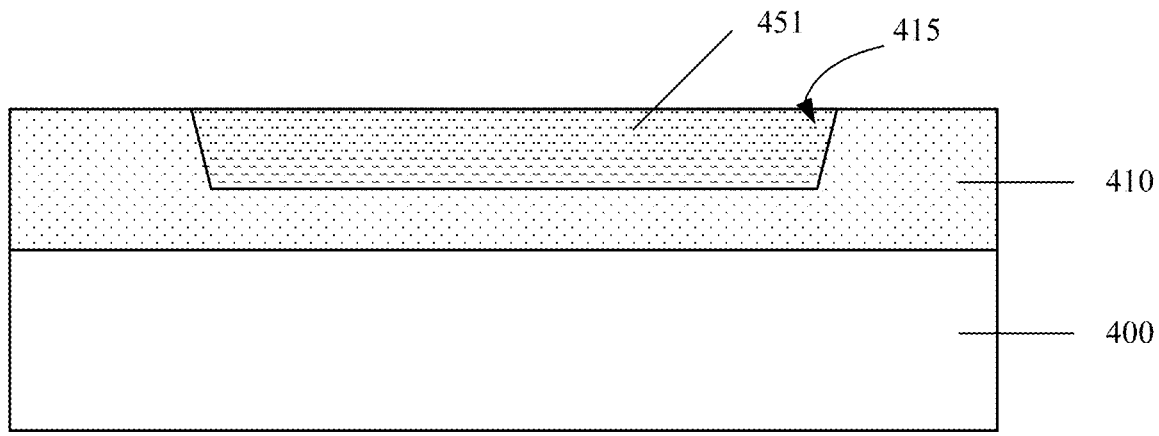

Further, returning to FIG. 22, a first cavity may be formed on the side surface of the first insulating material layer that faces away from the first substrate (S22). FIG. 24 illustrates a schematic cross-sectional view of a corresponding structure consistent with some embodiments of the present disclosure.

Referring to FIG. 24, a first cavity 415 may be formed in the first insulating material layer 410 from the second surface of the first insulating material layer 410. That is, the first cavity 415 may have an opening on the second surface of the first insulating material layer 410.

The first cavity 415 may be formed through a wet etching process, a dry etching process, or a process combining wet etching and dry etching. The first cavity 415 may not be limited to any specific shape. For example, the first cavity 415 may have any appropriate shape, such as a rectangular shape, or other polygonal shape. The first cavity 415 may not be limited to any specific size either. For example, the height, the side length, the occupied area, etc. of the first cavity 415 may be determined according to the actual needs.

Returning to FIG. 22, further, a first sacrificial material layer may be formed in the first cavity (S23). Referring to FIG. 24, a first sacrificial material layer 451 may be formed to fill the first cavity 415. The first sacrificial material layer 451 may be made of silicon oxide, carbon-rich dielectric material, germanium, hydrocarbon polymer, or amorphous silicon. In one embodiment, the first sacrificial material layer 451 may be made of amorphous carbon. It should be noted that the material selection for the first sacrificial material layer 451 may not be limited to the materials list above, any appropriate material known to those skilled in the art may be used to form the first sacrificial material layer 451.

In one embodiment, the top surfaces of the first sacrificial material layer 451 and the first insulating material layer 410 may be leveled with each other. A planarization process may be performed to ensure that the top surface of the first sacrificial material layer 451 is leveled with the top surface of the first insulating material layer 410.

Returning to FIG. 22, further, a first conductive film and a piezoelectric film may be formed on the first insulating material layer and the first sacrificial material layer (S24).

Figure 25:
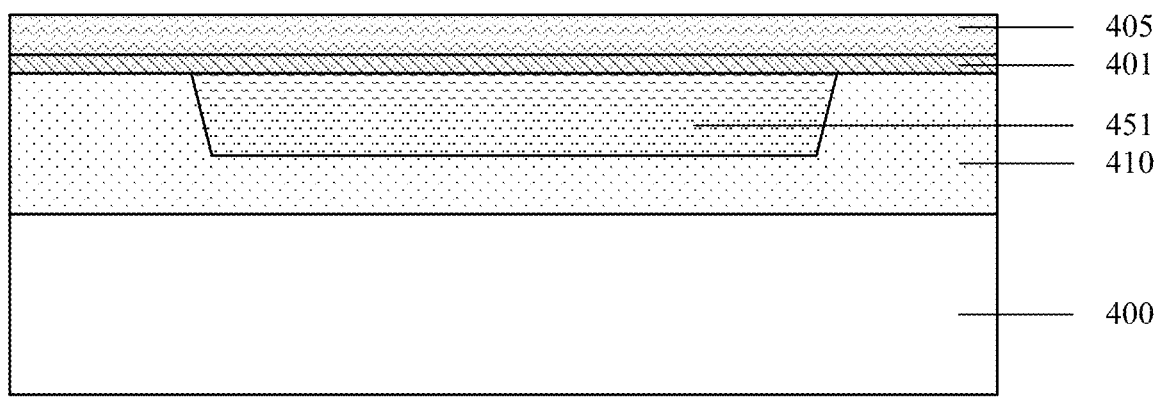

FIG. 25 illustrates a schematic cross-sectional view of a corresponding structure consistent with some embodiments of the present disclosure.

Referring to FIG. 25, a first conductive film 401 and a piezoelectric film 405 may be formed on the first insulating material layer 410 and the first sacrificial material layer 451.

In one embodiment, the first conductive film 401 may be made of a metal or alloy including at least one of Al, Cu, Ni, W, Ti, Mo, Ag, Au, Pt, etc.

In one embodiment, the piezoelectric film 405 may be made of a material including at least one of aluminum nitride, zinc oxide, and lead-zinc titanite.

Figure 26:
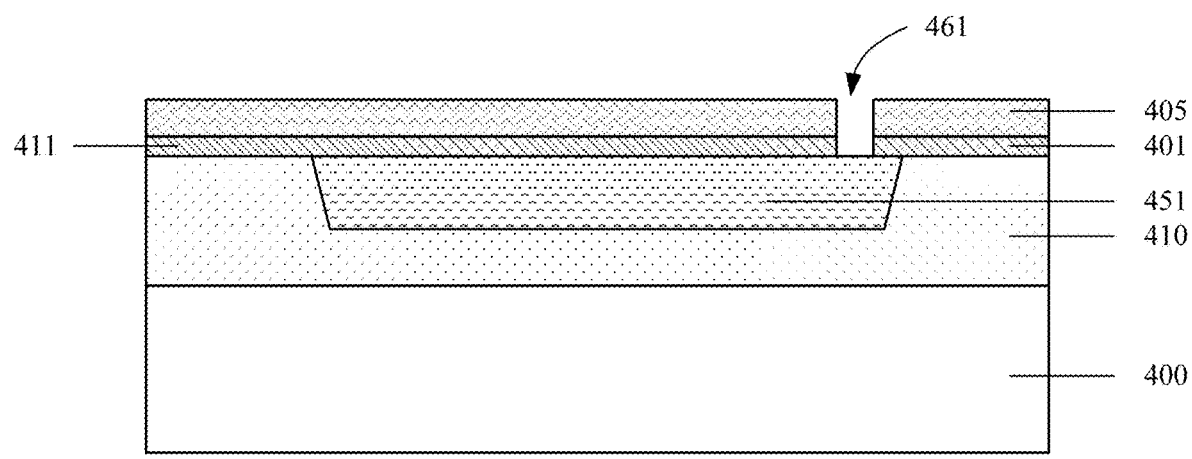

Returning to FIG. 22, further, the piezoelectric film and the first conductive film may be etched to expose a portion of the first sacrificial material layer, and thus form a first electrode cavity and a first electrode (S25). FIG. 26 illustrates a schematic cross-sectional view of a corresponding structure consistent with some embodiments of the present disclosure.

Referring to FIG. 26, the piezoelectric film 405 and the first conductive film 401 may be etched to expose a portion of the first sacrificial material layer 451, and thus form a first electrode cavity 461 and a first electrode 411.

Figure 27:
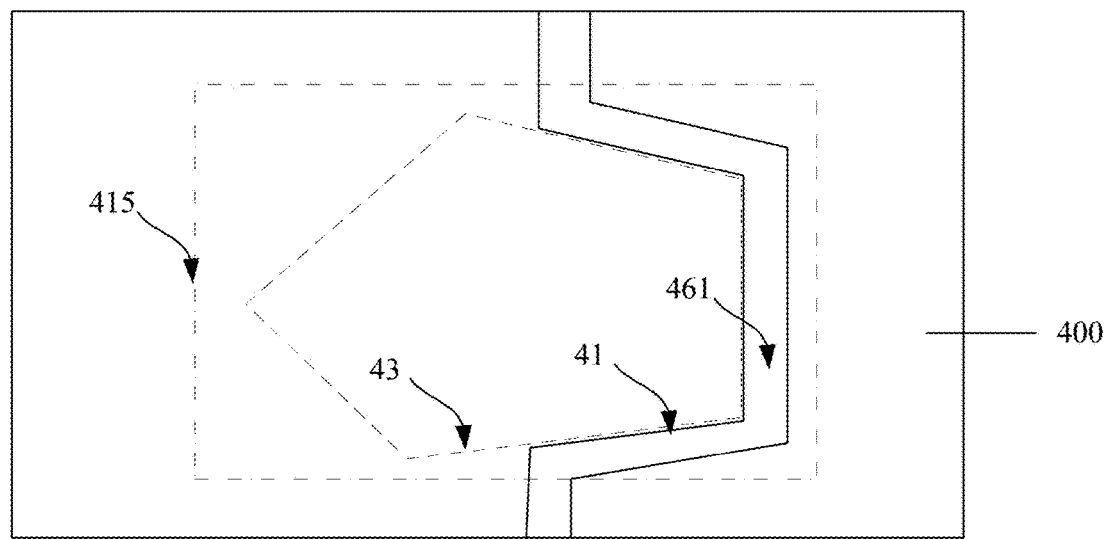

FIG. 27 illustrates a schematic top view of the first electrode cavity 461. A boundary of the piezoelectric oscillation plate is indicated by a dashed frame labeled as 43. Referring to FIGS. 26-27, the first electrode cavity 461 may have a first boundary 41, and after etching the piezoelectric film 405 and the first conductive film 401 to form the first electrode cavity 461 and the first electrode 411, a portion of the first insulating material layer 410 may also be exposed.

The etching process in Step S25 may be substantially similar to the etching process in Step S13 described above. In one embodiment, because of the presence of the first insulating material layer 410, further fabricating the temperature compensation film may not be necessary.

As shown in FIG. 26, after etching, the portion of the first conductive film 401 with a greater volume (i.e., covering more area of the first sacrificial material layer 451) may serve as the first electrode 411, and the other remaining portion of the first conductive film 401 with a smaller volume may become a supporting sheet.

Figure 28:
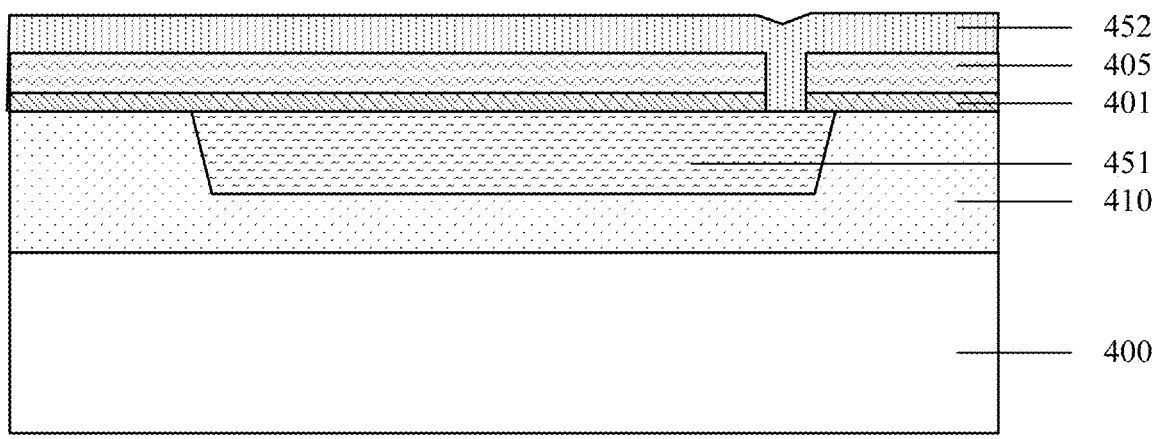
Figure 29:
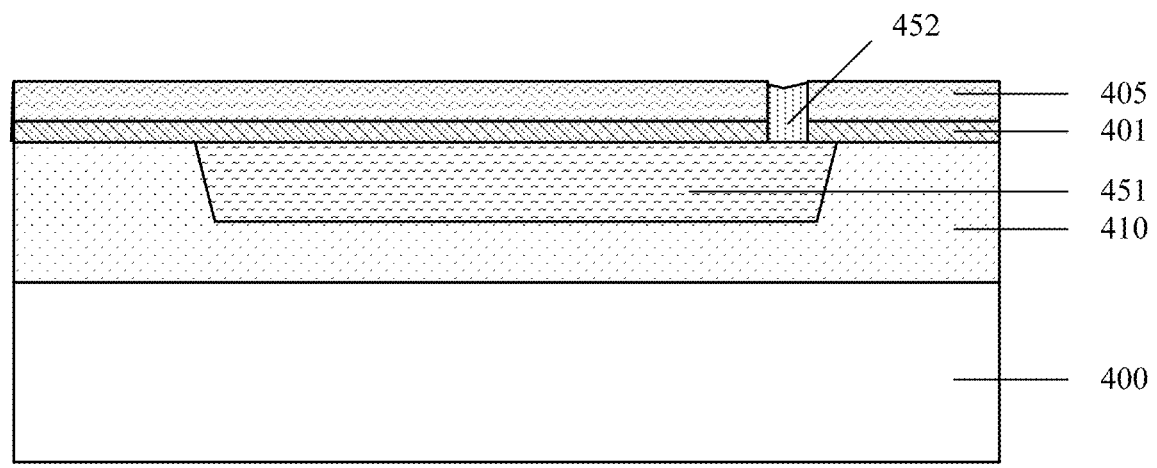

Further, returning to FIG. 22, a second sacrificial material layer may be formed to fill up the first electrode cavity (S26). FIG. 28-29 illustrate schematic cross-sectional views of corresponding structures in the process of forming a second sacrificial material layer consistent with some embodiments of the present disclosure.

Referring to FIG. 28, a second sacrificial material layer 452 may be formed on the piezoelectric film 405. The second sacrificial material layer 452 may fill up the first electrode cavity 461 (referring to FIG. 26).

In one embodiment, the second sacrificial material layer 452 may be made of silicon oxide, carbon-rich dielectric material, germanium, hydrocarbon polymer, or amorphous silicon. In one embodiment, the second sacrificial material layer 452 may be made of amorphous carbon. It should be noted that the material selection for the second sacrificial material layer 452 may not be limited to the materials list above, any appropriate material known to those skilled in the art may be used to form the second sacrificial material layer 452.

Further, referring to FIG. 29, the portion of the second sacrificial material layer 452 formed on the piezoelectric film 405 may be removed, and the portion of the second sacrificial material layer 452 formed in the first electrode cavity may remain. As such, the second sacrificial material layer may be able to fill up the first electrode cavity.

Figure 30:
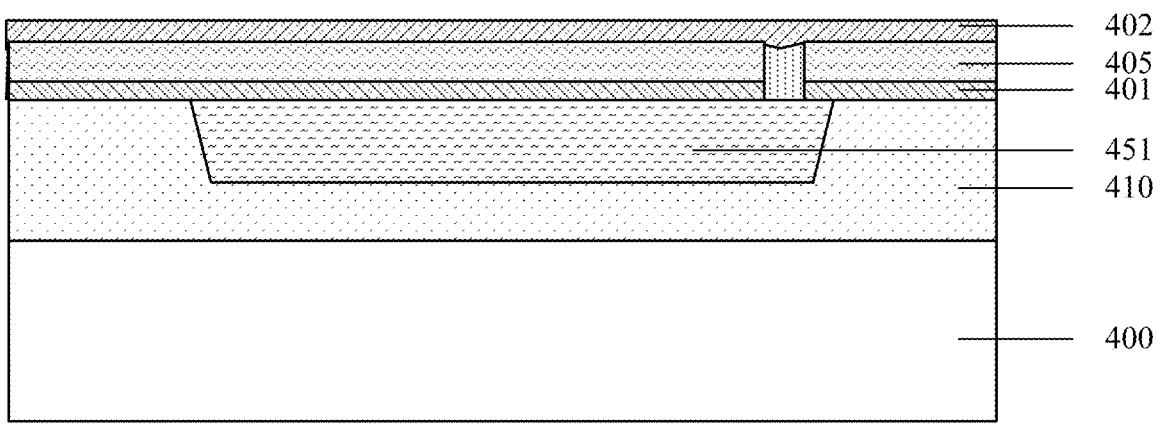

Further, returning to FIG. 22, a second conductive film may be formed on the piezoelectric film (S27). FIG. 30 illustrates a schematic cross-sectional view of a corresponding structure consistent with some embodiments of the present disclosure.

Referring to FIG. 30, a second conductive film 402 may be formed on the piezoelectric film 405. In one embodiment, the second conductive film 402 may also cover the second sacrificial material layer formed in the first electrode cavity.

In one embodiment, the second conductive film 402 may be made of a metal or alloy including at least one of Al, Cu, Ni, W, Ti, Mo, Ag, Au, Pt, etc.

Figure 31:
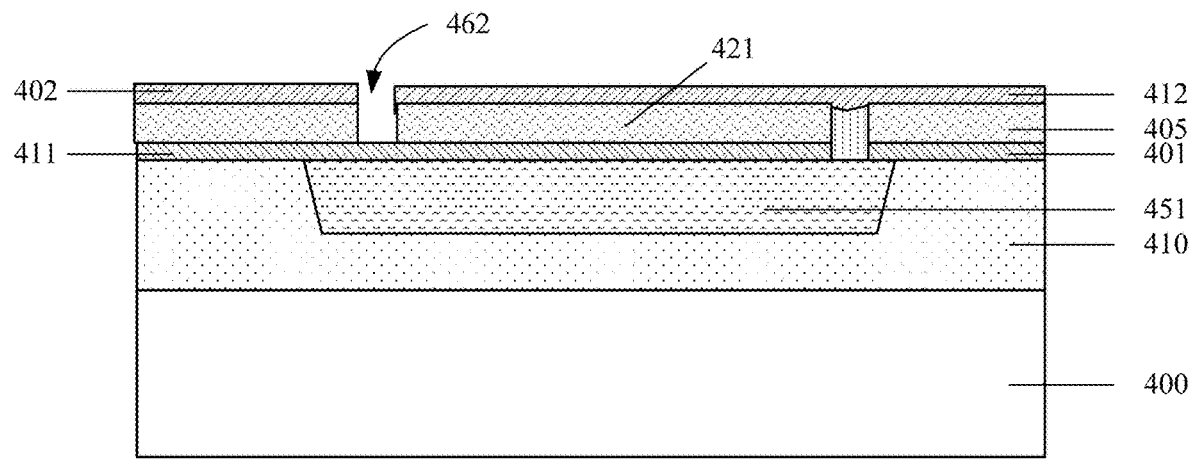
Figure 33:
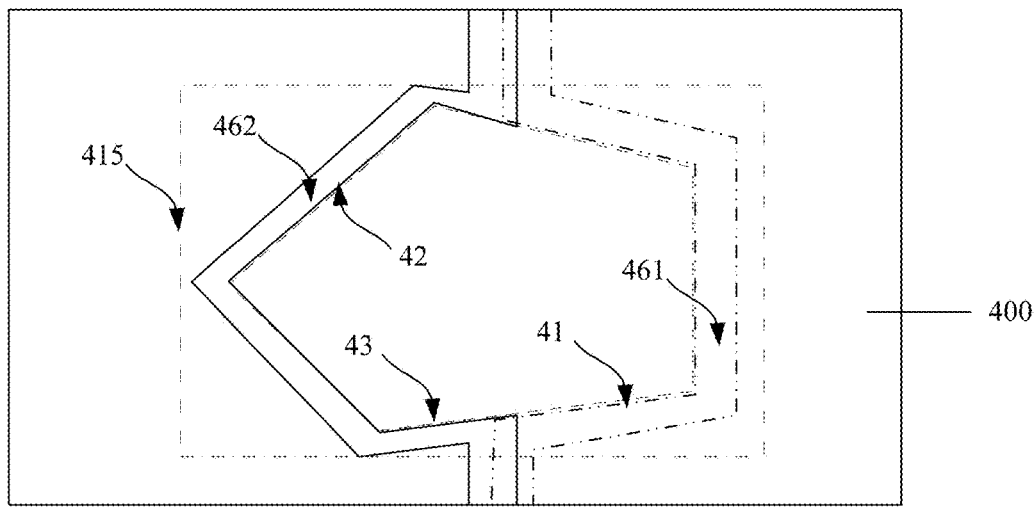
FIG. 33 illustrate a schematic top view of a film BAWR according to another embodiment of the present disclosure.

Further, returning to FIG. 22, the second conductive film and the piezoelectric film may be etched to expose a portion of the first conductive film (i.e. the first electrode), and thus form a second electrode cavity, a second electrode, and a piezoelectric oscillation plate (S28). FIG. 31 and FIG. 33 illustrate schematic views of a corresponding structure consistent with some embodiments of the present disclosure. Specifically, FIG. 31 illustrates a schematic cross-sectional view of the structure and FIG. 33 illustrates a schematic top view of the structure.

Referring to FIG. 31 and FIG. 33, the second conductive film 402 and the piezoelectric film 405 may be etched to expose a portion of the first conductive film 401 (i.e., the first electrode 411). As such, a second electrode cavity 462, a second electrode 412, and a piezoelectric oscillation plate 421 may be formed. As shown in FIG. 33, the orthogonal projection of the second electrode cavity 462 may overlap with the orthogonal projection of the first electrode cavity 461. The boundary 43 of the piezoelectric oscillation plate 421 may be formed jointly by the boundary 41 of the first electrode cavity 461 and the boundary 42 of the second electrode cavity 462, and the boundary 42 of the piezoelectric oscillation plate 421 may have an irregular polygonal shape without having any two edges parallel to each other.

As shown in FIG. 31, after etching the second conductive film 402 and the piezoelectric film 405, the portion of the second conductive film 402 with a greater volume (i.e., covering more area of the piezoelectric film 405) may become the second electrode 412, and the other remaining portion of the second conductive film 402 with a smaller volume may become a supporting sheet.

Figure 32:
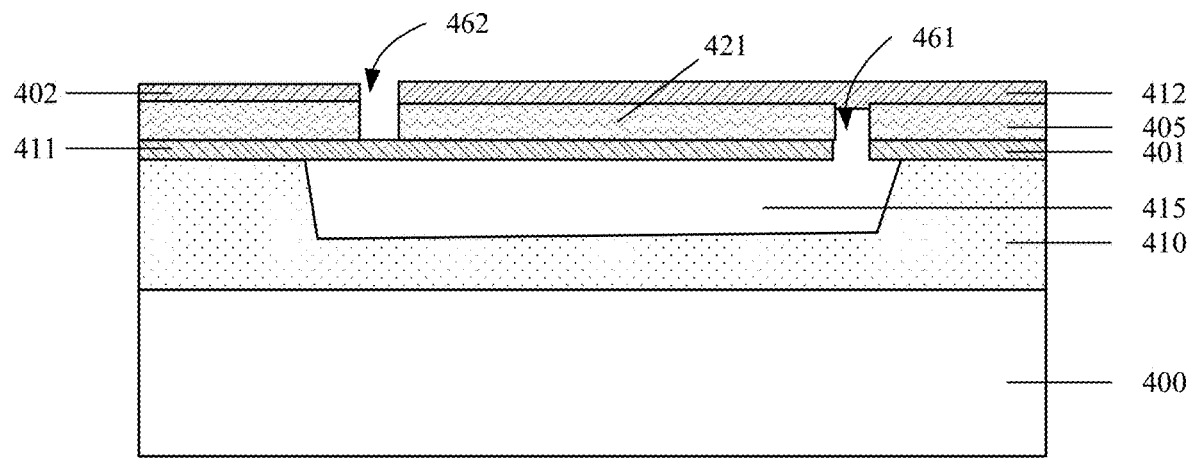

Further, returning to FIG. 22, the first sacrificial material layer and the second sacrificial material layer may be removed (S29). FIG. 32 illustrates a schematic cross-sectional view of a corresponding structure consistent with some embodiments of the present disclosure.

Referring to FIG. 32, the first sacrificial material layer 451 (referring to FIG. 29) and the second sacrificial material layer 452 (referring to FIG. 29) may be removed.

After performing Step S29 to remove the first sacrificial material layer and the second sacrificial material layer, the relationship between cavities may become more evident. For example, the boundary 43 of the piezoelectric oscillation plate may be formed jointly by the boundary 41 of the first electrode cavity 461 and the boundary 42 of the second electrode cavity 462. In the top view shown in FIG. 33, the orthogonal projection of the first electrode cavity 461 and the orthogonal projection of the second electrode cavity 462 may have an overlapped region. Each top view of the first electrode cavity 461 and the second electrode cavity 462 may have a polyline-shaped center line. On the same side along the polyline-shaped center line of the first electrode cavity 461, different edges of the boundary 41 of the first electrode cavity 461 may not be parallel to each other, and on the same side along the polyline-shaped center line of the second electrode cavity 462, different edges of the boundary 42 of the second electrode cavity 462 may not be parallel to each other either. In addition, each edge of the boundary 41 of the first electrode cavity 461 may not be parallel to any edge of the boundary 42 of the second electrode cavity 462.

According to the process described above, in the embodiments of the present disclosure, a sacrificial layer is formed in the first cavity, and then a non-penetrating first electrode cavity and a non-penetrating second electrode cavity are sequentially formed. The first electrode cavity is separated from the second electrode cavity, but the first electrode cavity and the second electrode cavity are partially overlapped with each other in a direction perpendicular to the piezoelectric oscillation plate. The sacrificial layer formed in the first cavity can be removed through the electrode cavity. Therefore, the fabrication method is flexible. Compared to the existing technology, in which a through hole R90 shown in FIG. 1 is formed in the upper and the lower electrodes, the disclosed film BAWR contains a piezoelectric oscillation plate having a boundary without any parallel edges. As such, the performance of the film BAWR is greatly improved.

Figure 34:
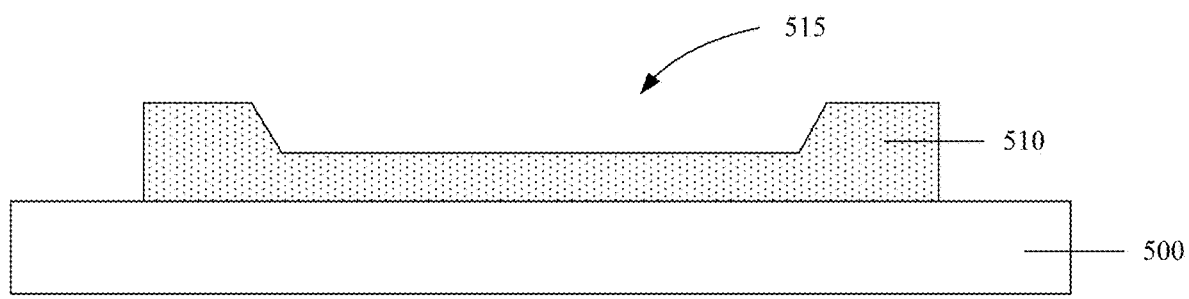

Further, the fabrication method for the film BAWR may further include providing a second substrate, forming a second insulating material layer on the second substrate, and forming a second cavity on the side surface of the second insulating material layer that faces away from the second substrate. FIG. 34 illustrates a schematic cross-sectional view of a corresponding structure consistent with some embodiments of the present disclosure.

Referring to FIG. 34, a second substrate 500 may be provided. A second insulating material layer 510 may be formed on the second substrate 500. The second insulating material layer 510 may have a first surface facing the second substrate 500, and a second surface opposite to the first surface. A second cavity 515 may be formed in the second insulating material layer 510 from the second surface. That is, the second cavity 515 may have an opening on the second surface of the second insulating material layer 510.

Figure 35:
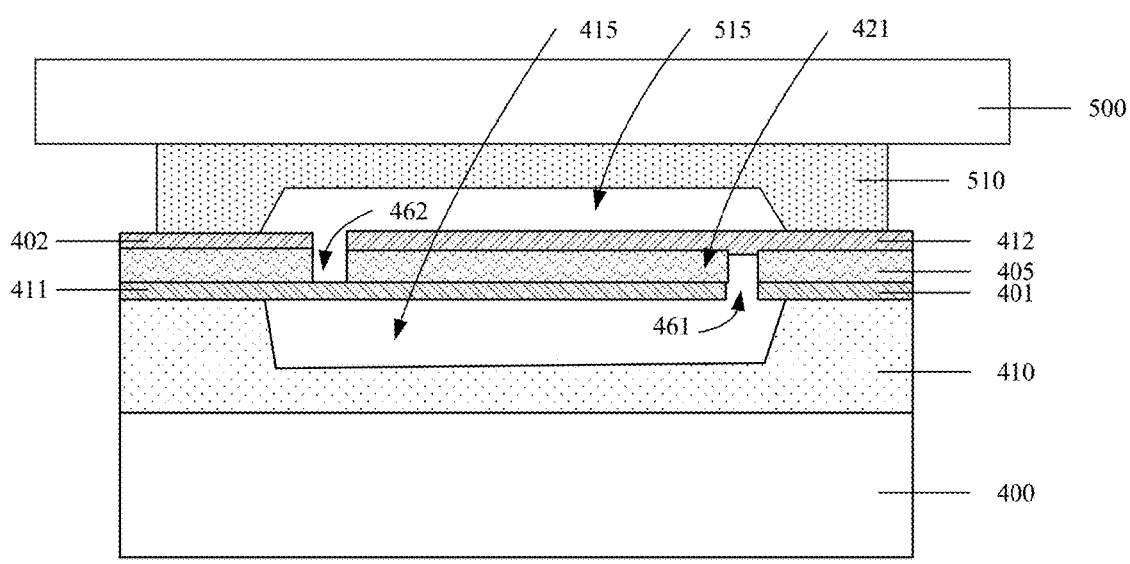

Further, the fabrication method for the film BAWR may also include bonding the first substrate and the second substrate together through bonding the second insulating material layer to the second conductive film (including the second electrode). FIG. 35 illustrates a schematic cross-sectional view of a corresponding structure consistent with some embodiments of the present disclosure.

Referring to FIG. 35, the fabrication method for the film BAWR may also include bonding the first substrate 400 and the second substrate 500 together through bonding the second insulating material layer 510 to the second conductive film 402 (including the second electrode 412). With respect to the acoustic-wave resonant plate, which is formed by the piezoelectric oscillation plate 421, the first electrode 411, and the second electrode 412, the second cavity 415 may be opposite to the first cavity 415. The boundary of the second cavity 515 may be a portion of the boundary of the piezoelectric oscillation plate 421.

According to the steps described above, a film BAWR may be formed. FIG. 33 and FIG. 35 illustrate schematic views of an exemplary film BAWR according to some embodiments of the present disclosure.

Referring to FIG. 33, and the film BAWR may include a first substrate 400, a first insulating material layer 410 formed on the first substrate 400, and a first cavity 415 formed in the first insulating material layer 410. The first cavity 415 may be formed on the surface of the first insulating material layer 410 that faces away from the first substrate 400.

The film BAWR may also include an acoustic-wave resonant plate formed above the first insulating material layer 410. The acoustic-wave resonant plate may include a first electrode 411, a second electrode 412, and a piezoelectric oscillation plate 421 formed between the first electrode 411 and the second electrode 412. The first electrode 421 may be disposed above the first insulating material layer 410 and the first cavity 415, and may include a first electrode cavity 461 disposed above the first cavity 415. The second electrode 412 may be disposed above the first insulating material layer 410 and the first cavity 415, and may include a second electrode cavity 462 disposed above the first cavity 415. At least a portion of the boundary 43 of the piezoelectric oscillation plate 421 may be formed jointly by the boundary 41 of the first electrode cavity 461 and the boundary 42 of the second electrode cavity 462, and the boundary 43 of the piezoelectric oscillation plate 421 may have an irregular polygonal shape without having any two edges parallel to each other.

In one embodiment, the first electrode 411 may be formed from a first conductive film only. The first electrode 411 (and the first conductive film) may be made of a metal or alloy including at least one of Al, Cu, Ni, W, Ti, Mo, Ag, Au, Pt, etc.

In one embodiment, the second electrode 412 may be formed from a second conductive film only. The second electrode 412 (and the second conductive film) may be made of a metal or alloy including at least one of Al, Cu, Ni, W, Ti, Mo, Ag, Au, Pt, etc.

In one embodiment, the acoustic-wave resonant plate may also include a first structure supporting sheet bonded to the first electrode 411, and a second structure supporting sheet bonded to the second electrode 412. The first structure supporting sheet 4 and the second structure supporting sheet 4 may be formed in a same layer as the piezoelectric oscillation plate 421, but may be separated from the piezoelectric oscillation plate 421. In addition, the first structure supporting sheet and the second electrode may be located at the two opposite ends of the piezoelectric oscillation plate 421.

In one embodiment, the film BAWR may further include a second insulating material layer 510. The second insulating material layer 510 may be disposed on the side surface of the acoustic-wave resonant plate that faces away from the first insulating material layer 410. A second cavity 515 may be formed in the second insulating material layer 410. With respect to the piezoelectric oscillation plate 421, the second cavity 515 may be opposite to the first cavity 415 and may have an opening facing the piezoelectric oscillation plate 421. The second cavity 515 may be opposite to the first cavity 415.

In one embodiment, with respect to the acoustic-wave resonant plate formed by the first electrode 411, the piezoelectric oscillation plate 421, and the second electrode 412, the second cavity 515 and the first cavity 415 may be mirror images of each other.

In one embodiment, the first insulating material layer 410 and the second insulating material layer 510 may be made of at least one of oxide, nitride, and carbide. For example, the first insulating material layer 410 and the second insulating material layer 510 may be made of silicon oxide, silicon nitride, silicon carbide, SiON, or any other appropriate material.

In one embodiment, the piezoelectric oscillation plate 421 may be made of a material including at least one of piezoelectric crystal or piezoelectric ceramic. For example, the piezoelectric oscillation plate 421 may be made of at least one of quartz, lithium gallate, lithium germanate, titanium germanate, lithium niobate, lithium tantalate, aluminum nitride, zinc oxide, and lead-zinc titanite.

In one embodiment, the film BAWR may also include a second substrate 500. The second insulating material layer 510 may be disposed on the second substrate 500.

Compared to existing film BAWR and fabrication methods, the disclosed film BAWR and fabrication methods demonstrate the following advantages.

According to the disclosed film BAWR, a piezoelectric oscillation plate sandwiched by a first electrode and a second electrode is entirely placed above a first cavity. The boundary of the piezoelectric oscillation plate has an irregular polygonal shape without having any two edges parallel to each other, and thus not only the additional standing wave oscillations that become clutter in the horizontal direction may be eliminated, but also the energy consumed by the lateral spurious waves may be minimized. Therefore, the filtering performance of the film BAWR, including the quality factor, may be effectively improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A film bulk acoustic wave resonator (BAWR), comprising:
a first substrate;
a first insulating material layer, formed on the first substrate;
a first cavity, formed in the first insulating material layer with an opening facing away from the first substrate;
an acoustic-wave resonant plate, including a first electrode, a piezoelectric oscillation plate, and a second electrode stacked on the first insulating material layer, wherein:
the piezoelectric oscillation plate is disposed between the first electrode and the second electrode,
the first electrode includes a first electrode cavity located above the first cavity,
the second electrode includes a second electrode cavity located above the first cavity,
at least a portion of a boundary of the piezoelectric oscillation plate is formed jointly by a boundary of the first electrode cavity and a boundary of the second electrode cavity,
the boundary of the piezoelectric oscillation plate has an irregular polygonal shape without having any two edges parallel to each other,
the upper portion of the first electrode cavity extends to the lower surface or upper surface of the piezoelectric oscillation plate, and
the lower portion of the second electrode cavity extends to the upper surface or lower surface of the piezoelectric oscillation plate.

2. The film BAWR according to claim 1, further including:

a second insulating material layer, formed on the acoustic-wave resonant plate in opposition to the first insulating material layer, wherein:
the second insulating material layer includes a second cavity with an opening facing the piezoelectric oscillation plate; and
a boundary of the second cavity is a portion of the boundary of the piezoelectric oscillation plate.

3. The film BAWR according to claim 2, wherein: the first insulating material layer and the second insulating material layer are made of a material including at least one of oxide, nitride, and carbide.

4. The film BAWR according to claim 1, wherein:
the acoustic-wave resonant plate further includes a first temperature compensation film formed above the first cavity and on the first electrode in opposition to the piezoelectric oscillation plate, wherein:
a thermal expansion coefficient of the first temperature compensation film is lower than thermal expansion coefficients of the first electrode and the second electrode.

5. The film BAWR according to claim 4, wherein: the first temperature compensation film is made of a material including at least one of oxide, nitride, and carbide.

6. The film BAWR according to claim 1, wherein:
the acoustic-wave resonant plate further includes a second temperature compensation film formed above the first cavity and on the second electrode in opposition to the piezoelectric oscillation plate, wherein
a thermal expansion coefficient of the second temperature compensation film is lower than thermal expansion coefficients of the first electrode and the second electrode.

7. The film BAWR according to claim 6, wherein: the second temperature compensation film is made of a material including at least one of oxide, nitride, and carbide.

8. The film BAWR according to claim 1, wherein the acoustic-wave resonant plate further includes:
a first structure supporting sheet bonded to the first electrode; and
a second structure supporting sheet bonded to the second electrode, wherein:
the first structure supporting sheet and the second structure supporting sheet are in a same layer but separated from the piezoelectric oscillation plate; and
the first structure supporting sheet and the second structure supporting sheet are respectively located on two opposite ends of the piezoelectric oscillation plate.

9. The film BAWR according to claim 1, wherein:
the first electrode and the second electrode are made of a material including at least one of Al, Cu, Ni, W, Ti, Mo, Ag, Au, and Pt; and
the piezoelectric oscillation plate is made of a material including at least one of piezoelectric crystal or piezoelectric ceramic.

10. The film BAWR according to claim 9, wherein: the piezoelectric oscillation plate is made of a material including at least one of quartz, lithium gallate, lithium germanate, titanium germanate, lithium niobate, lithium tantalate, aluminum nitride, zinc oxide, and lead-zinc titanite.

11. A method for fabricating a film BAWR, comprising:
forming a first insulating material layer on a first substrate;
forming a first cavity in the first insulating material layer with an opening facing away from the first substrate;

sequentially forming a second conductive film, a piezoelectric film, and a first conductive film on a sacrificial substrate;
forming a first electrode cavity by removing a portion of the first conductive film, wherein a remaining portion of the first conductive film forms a first electrode;
removing a portion of the piezoelectric film exposed by the first electrode cavity to expose a portion of the second conductive film;
bonding the first substrate and the sacrificial substrate together by bonding the first insulating material layer to the first conductive film, wherein after bonding, the first electrode cavity is located above the first cavity;
removing the sacrificial substrate;
forming a second electrode cavity by removing a portion of the second conductive film above the first cavity, wherein a remaining portion of the second conductive film forms a second electrode; and
forming a piezoelectric oscillation plate by removing a portion of the piezoelectric film in the second electrode cavity to expose a portion of the first conductive film, wherein at least a portion of a boundary of the piezoelectric oscillation plate is formed jointly by a boundary of the first electrode cavity and a boundary of the second electrode cavity, the boundary of the piezoelectric oscillation plate has an irregular polygonal shape without having any two edges parallel to each other, the upper portion of the first electrode cavity extends to the lower surface or upper surface of the piezoelectric oscillation plate, and the lower portion of the second electrode cavity extends to the upper surface or lower surface of the piezoelectric oscillation plate.

12. The method for fabricating the film BAWR according to claim 11, wherein:
the first electrode and the second electrode are made of a material including at least one of Al, Cu, Ni, W, Ti, Mo, Ag, Au, and Pt; and
the piezoelectric oscillation plate is made of a material including at least one of piezoelectric crystal or piezoelectric ceramic.

13. The method for fabricating the film BAWR according to claim 12, wherein:
the piezoelectric oscillation plate is made of a material including at least one of quartz, lithium gallate, lithium germanate, titanium germanate, lithium niobate, lithium tantalate, aluminum nitride, zinc oxide, and lead-zinc titanite.

14. The method for fabricating the film BAWR according to claim 11, prior to bonding the first substrate and the sacrificial substrate together by bonding the first insulating material layer to the first conductive film, further including:
forming a first temperature compensation film on the first electrode in opposition to the piezoelectric oscillation plate, wherein the first temperature compensation film is made of a material including at least one of oxide, nitride, and carbide, and a thermal expansion coefficient of the first temperature compensation film is lower than thermal expansion coefficients of the first electrode and the second electrode.

15. The method for fabricating the film BAWR according to claim 11, after bonding the first substrate and the sacrificial substrate together by bonding the first insulating material layer to the first conductive film, further including:
forming a second temperature compensation film on the second electrode in opposition to the piezoelectric oscillation plate, wherein the second temperature compensation film is made of a material including at least one of oxide, nitride, and carbide, and a thermal expansion coefficient of the second temperature compensation film is lower than thermal expansion coefficients of the first electrode and the second electrode.

16. The method for fabricating the film BAWR according to claim 11, further including:
forming a second insulating material layer on a second substrate;
forming a second cavity in the second insulating material layer with an opening facing away from the second substrate; and
bonding the second substrate and the first substrate together by bonding the second insulating material layer to the first insulating material layer, wherein:
an acoustic-wave resonant plate including the first electrode, the piezoelectric oscillation plate, and the second electrode is sandwiched between the second cavity and the first cavity, and
a boundary of the second cavity is a portion of the boundary of the piezoelectric oscillation plate.

17. The method for fabricating the film BAWR according to claim 16, wherein the first insulating material layer and the second insulating material layer are made of a material including at least one of oxide, nitride, and carbide.

18. A method for fabricating a film BAWR, comprising:
forming a first insulating material layer on a first substrate;
forming a first cavity in the first insulating material layer with an opening facing away from the first substrate;
forming a first sacrificial material layer in the first cavity, wherein a top surface of the first sacrificial material layer is leveled with a top surface of the first insulating material layer;
sequentially forming a first conductive film and a piezoelectric film on the first insulating material layer and the first sacrificial material layer;
forming a first electrode cavity by removing a portion of the piezoelectric film and a portion of the first conductive film above the first sacrificial material layer to expose a portion of the first sacrificial material layer, wherein a remaining portion of the first conductive film forms a first electrode;
forming a second sacrificial material layer to fill the first electrode cavity;
forming a second conductive film on the piezoelectric film and the second sacrificial material layer;
forming a second electrode cavity by removing a portion of the second conductive film and a portion of the piezoelectric film formed above the first sacrificial material layer to expose a portion of the first conductive film, wherein a remaining portion of the second conductive film forms a second electrode, a remaining portion of the piezoelectric film forms a piezoelectric oscillation plate, the second electrode cavity and the first electrode cavity are partially overlapped with each other, at least a portion of a boundary of the piezoelectric oscillation plate is formed jointly by a boundary of the first electrode cavity and a boundary of the second electrode cavity, the boundary of the piezoelectric oscillation plate has an irregular polygonal shape without having any two edges parallel to each other, the upper portion of the first electrode cavity extends to the lower surface or upper surface of the piezoelectric oscillation plate, and the lower portion of the second electrode cavity extends to the upper surface or lower surface of the piezoelectric oscillation plate; and removing the first sacrificial material layer and the second sacrificial material layer.

19. The method for fabricating the film BAWR according to claim 18, further including:
forming a second insulating material layer on a second substrate;
forming a second cavity in the second insulating material layer with an opening facing away from the second substrate; and
bonding the second substrate and the first substrate together by bonding the second insulating material layer to the first insulating material layer, wherein:
an acoustic-wave resonant plate including the first electrode, the piezoelectric oscillation plate, and the second electrode is sandwiched between the second cavity and the first cavity, and
a boundary of the second cavity is a portion of the boundary of the piezoelectric oscillation plate.

20. The method for fabricating the film BAWR according to claim 18, wherein:
the first sacrificial material layer and the second sacrificial material layer are removed by a wet etching process.

* * * * *